United States Patent
Wu et al.

(10) Patent No.: US 12,205,879 B2
(45) Date of Patent: *Jan. 21, 2025

(54) SYMMETRICAL SUBSTRATE FOR SEMICONDUCTOR PACKAGING

(71) Applicant: Taiwan Semiconductor Manufacturing Co., Ltd., Hsinchu (TW)

(72) Inventors: Jiun Yi Wu, Zhongli (TW); Chen-Hua Yu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/362,401

(22) Filed: Jul. 31, 2023

(65) Prior Publication Data

US 2024/0021510 A1    Jan. 18, 2024

Related U.S. Application Data

(60) Continuation of application No. 17/874,062, filed on Jul. 26, 2022, now Pat. No. 11,776,886, which is a
(Continued)

(51) Int. Cl.
*H01L 23/495* (2006.01)
*H01L 21/48* (2006.01)
*H01L 23/498* (2006.01)

(52) U.S. Cl.
CPC .... *H01L 23/49833* (2013.01); *H01L 21/4857* (2013.01); *H01L 23/49816* (2013.01); *H01L 23/49822* (2013.01); *H01L 23/49894* (2013.01)

(58) Field of Classification Search
CPC .......... H01L 23/49833; H01L 21/4857; H01L 23/49816; H01L 23/49822;
(Continued)

(56) References Cited

U.S. PATENT DOCUMENTS 9,000,584 B2   4/2015   Lin et al.
9,048,222 B2   6/2015   Hung et al.
(Continued)

FOREIGN PATENT DOCUMENTS

TW    202002105 A    1/2020

*Primary Examiner* — Theresa T Doan
(74) *Attorney, Agent, or Firm* — Slater Matsil, LLP

(57) ABSTRACT

An integrated circuit package that includes symmetrical redistribution structures on either side of a core substrate is provided. In an embodiment, a device comprises a core substrate, a first redistribution structure comprising one or more layers, a second redistribution comprising one or more layers, a first integrated circuit die, and a set of external conductive features. The core substrate is disposed between the first redistribution structure and the second redistribution structure, the first integrated circuit die is disposed on the first distribution structure on the opposite side from the core substrate; and the set of external conductive features are disposed on a side of the second redistribution structure opposite the core substrate. The first redistribution structure and second redistribution structure have symmetrical redistribution layers to each other with respect to the core substrate.

20 Claims, 26 Drawing Sheets

Related U.S. Application Data division of application No. 16/998,770, filed on Aug. 20, 2020, now Pat. No. 11,482,484.

(60) Provisional application No. 62/982,409, filed on Feb. 27, 2020.

(58) Field of Classification Search
CPC ......... H01L 23/49894; H01L 23/49827; H01L 23/5386; H01L 23/49838
USPC ........................................................ 257/668
See application file for complete search history.

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 11,776,886 B2 * | 10/2023 | Wu ................... H01L 23/49816 257/668 |
| 2019/0079958 A1 | 3/2019 | Bentley et al. |
| 2019/0115258 A1 | 4/2019 | Tsai et al. |
| 2019/0296002 A1 | 9/2019 | Pei et al. |
| 2020/0006214 A1 | 1/2020 | Tsai et al. |

* cited by examiner

SYMMETRICAL SUBSTRATE FOR SEMICONDUCTOR PACKAGING

PRIORITY CLAIM AND CROSS-REFERENCE

This application is a continuation of U.S. application Ser. No. 17/874,062, filed on Jul. 26, 2022, which is a divisional of U.S. application Ser. No. 16/998,770, filed on Aug. 20, 2020, now U.S. Pat. No. 11,482,484 issued on Oct. 25, 2022, entitled "Symmetrical Substrate for Semiconductor Packaging," which claims the benefit of U.S. Provisional Patent Application No. 62/982,409, filed Feb. 27, 2020, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
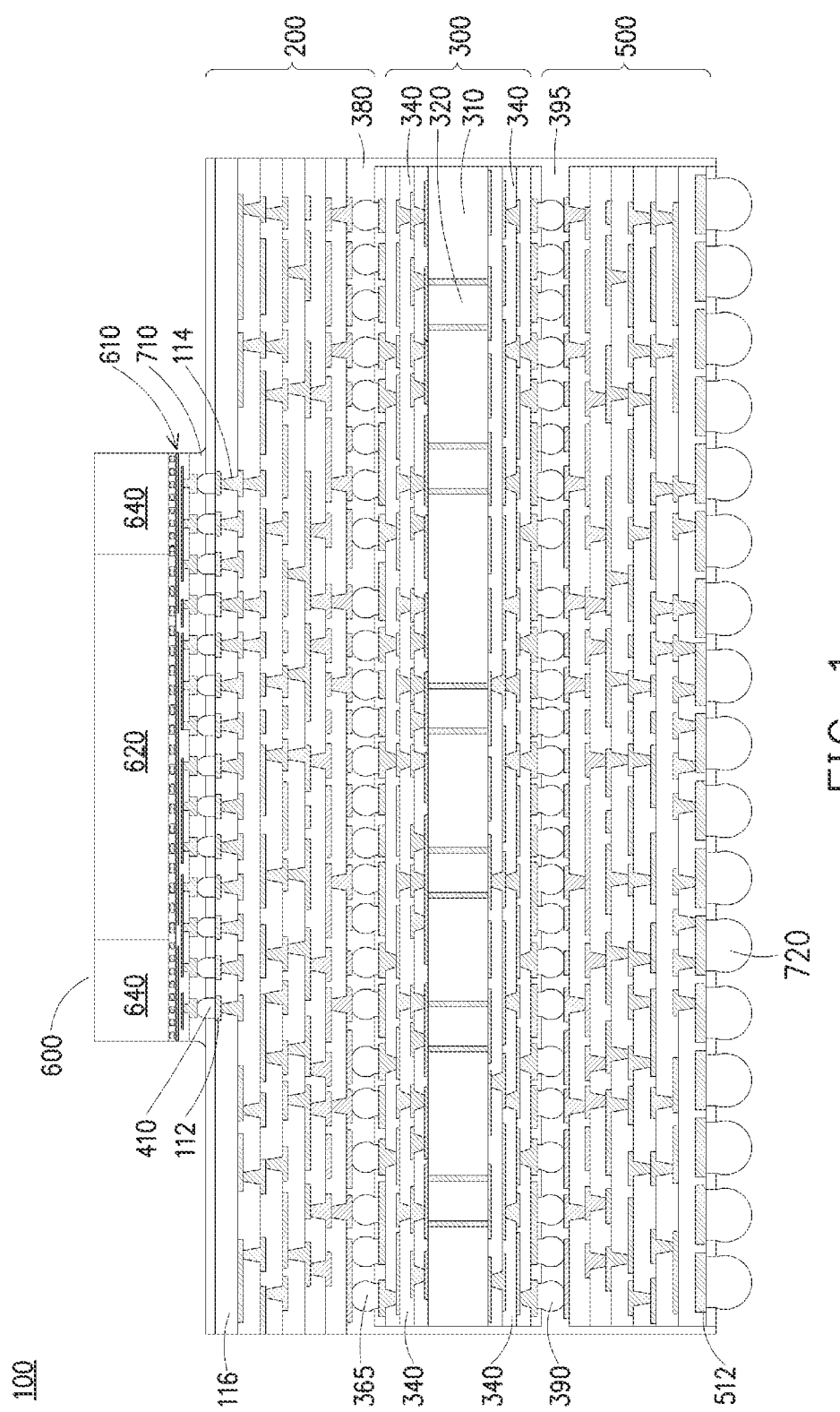
FIG. 1 illustrates a cross-sectional view of a package component in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a package component is formed having one or more integrated circuit dies. The package component has symmetrical redistribution structures connected to either side of a core substrate. One of the redistribution structures is additionally connected to the integrated circuit dies and provides electrical connection between the integrated circuit dies and the core substrate and/or between the integrated circuit dies. The other redistribution structure is additionally connected to a set of external conductive features and provides electrical connection between the external conductive features and the core substrate. In such a manner, the integrated circuit dies are electrically connected to the core substrate, and ultimately to the external conductive features, through the core substrate and the redistribution structures. By forming symmetrical redistributions structures on either side of the core substrate, stresses are reduced and/or equalized along opposing sides of the core substrate, thereby reducing warpage and increasing component and board reliability.

In accordance with some embodiments, each redistribution structure, as well as the core substrate and the integrated circuit dies, may be individually fabricated and tested prior to assembling the completed package component. This further increases component and board level reliability.

In accordance with some embodiments, the symmetrical construction of the redistribution structures further allows for a higher redistribution structure layer count in each of the redistribution structures by equalizing the warpage factors on either side of the core substrate. This allows for the addition of more buffer layers, further mitigating board level reliability risk.

In accordance with some embodiments, conductive connectors used to connect the core substrate to each of the redistribution structures may take the form of, for example, a ball grid array (BGA). Integration of such conductive connectors may provide flexibility in placement for semiconductor devices, such as integrated power delivery (IPD) chips, including integrated voltage regulators (IVRs) and active chips, among other electrical components, to implement system-on-a-chip type of package components, thus reducing fabrication complexity. Such embodiments may also provide a greater amount of flexibility for various other package configurations as well.

FIG. 1 illustrates a cross-sectional view of a singulated package component 100 in accordance with some embodiments. The singulated package component 100 includes a semiconductor device (e.g., an integrated circuit package 600), a first redistribution structure 200 having one or more redistribution layers, a second redistribution structure 500 having one or more redistribution layers, a core substrate 300, and external connectors 720, among other elements. The integrated circuit package 600 may include one or more dies, such as a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. In some embodiments, the semiconductor device may be an integrated circuit die.

The integrated circuit package 600 may include a plurality of integrated circuit dies. As shown, the integrated circuit package 600 includes a logic die 620, and two input/output (I/O) dies 640 for illustrative purposes. The integrated circuit dies may be formed in one or more wafers, which may include different device regions that are singulated in subsequent steps. The integrated circuit dies may be packaged with other similar or different integrated circuit dies using known manufacturing techniques. The integrated circuit package 600 may include a redistribution structure 610, providing electrical pathing and connection between, for example, the logic die 620 and the I/O dies 640, as well as connection from the integrated circuit package to conductive connectors 410.

Conductive connectors 410 provide the electrical connection between the first redistribution structure 200 and the integrated circuit package 600. An underfill 710 may be included to securely bond the integrated circuit package 600 to the first redistribution structure 200 and provide structural support and environmental protection.

As discussed in greater detail below, the first redistribution structure 200 provides electrical pathing and connection between the integrated circuit package 600 and a core substrate 300 via conductive connectors 365. In some embodiments, the first redistribution structure 200 has one or more redistribution layers comprising metallization patterns, comprising, for example, conductive lines 112 and conductive vias 114, and dielectric layers 116 separating adjacent layers of the conductive lines 112. Select the conductive lines 112 of metallization patterns may be interconnected with an overlying or underlying conductive feature using the conductive vias 114.

The first redistribution structure 200 may be electrically and mechanically attached to the core substrate 300. The core substrate 300 may include a central core 310, with conductive vias 320 extending through the central core 310, and additional optional redistribution structures 340 along opposing sides of the central core 310. Generally, the core substrate 300 provides structural support for the component package, as well as providing electrical signal routing between the integrated circuit package and the external connectors 80.

The second redistribution structure 500 provides additional routing and is attached to the core substrate 300 on an opposing side of the core substrate 300 from the first redistribution structure 200. The second redistribution structure 500 may have a similar structure as the first redistribution structure 200. Encapsulant 380 may be included between the first redistribution structure 200 and the core substrate 300, and encapsulant 395 may be included between the core substrate 300 and the second redistribution structure 500 to securely bond the associated elements and provide structural support and environmental protection.

As illustrated in the embodiment shown in FIG. 1, redistribution layers in the first redistribution structure 200 and the second redistribution structure 500 are symmetrical within the singulated package component 100 with respect to the core substrate 300. Due to the balanced design, fabrication stresses across the singulated package component 100 are approximately equalized on either side of the core substrate 30. In some embodiments, the first redistribution structure 200 and the second redistribution structure 500 comprise similar structures, e.g., a similar number and type of metallization patterns, including conductive lines 112 and conductive vias 114, and dielectric layers 116. In this manner warpage issues which may result from coefficient of thermal expansion (CTE) mismatches between the different layers of the singulated package component 100 are reduced. For example, in some embodiments the CTE of the first redistribution structure 200 and the second redistribution structure 500 is between 8 and 25. In some embodiments, the CTE of the first redistribution structure 200 may be within a range of 50% to 100% of a CTE of the second redistribution structure 500.

Additionally, in some embodiments, such as shown in FIG. 1, redistribution layers of the first redistribution structure 200 and the second redistribution structure 500 are such that in addition to the first redistribution structure 200 and the second redistribution structure 500 comprising the similar number and type of redistribution layers, the redistribution layers are also presented in the same order when viewed from the core substrate 300.

In some embodiments, longer linear electrical pathways are formed in redistribution layers of the first redistribution structure 200 and the second redistribution structure 500 further from the core substrate 300 using thicker and/or wider metallization dimensions. For example, the dielectric layers of redistribution layers further from the core substrate 300 may be formed using an encapsulant and subsequently planarized with a CMP process, while redistribution layers closer to the core substrate 300 are fabricated using photosensitive materials that are patterned using a lithography processes. In such embodiments, the roughness of the planarized layers can be well controlled and more easily and reliably built up to larger thicknesses. In such a case, thicker and wider metallization dimensions may be utilized in the planarized layers to decrease the overall impedance of metallization pathways per unit length. Further, the metallization patterns of a redistribution layer further from the core substrate 300 may be formed to a greater pitch than the metallization patterns of a layer closer to the core substrate 300.

As will be realized, the fabrication of devices using embodiments such as those discussed herein may improve circuit efficiency and/or reduces heat generation and power consumption. For example, circuit loads may be reduced for the same linear length of a given metallization pathway by increasing the thickness and/or width of the metallization pattern, thus increasing efficiency, while reducing power consumption and heat generation. In some embodiments, larger overall package dimensions may be achieved with the same or similar circuit design by extending metallization pathways horizontally with thicker and/or wider metallization pathways.

FIGS. 2 through 9 illustrates various intermediate stages in fabricating a first redistribution structure 200 (see FIG. 9), in accordance with some embodiments. A first package region 101A and a second package region 101B are illustrated where each package region is eventually singulated from other package regions. The illustrations of the individual features have been simplified in FIGS. 2-9 for ease of illustration.

Figure 2:
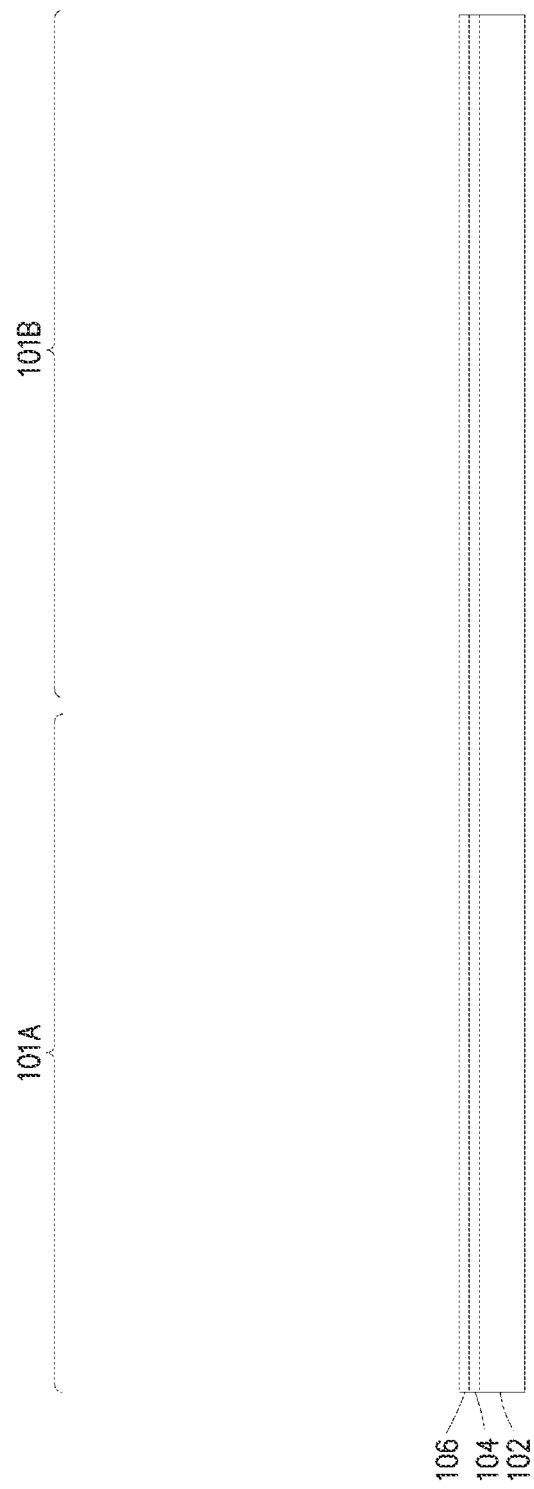
FIGS. 2 through 11 and 14 through 26 illustrate cross-sectional views of intermediate steps during a process for forming a package component in accordance with some embodiments.

Referring first to FIG. 2, a carrier substrate 102 is provided, a release layer 104 is formed on the carrier substrate 102, and a protective layer 106 is formed over the release layer 104. The carrier substrate 102 may be a glass carrier substrate, a ceramic carrier substrate, or the like. The carrier substrate 102 may be a wafer, such that multiple redistribution structures can be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and be substantially planar within process variations.

The protective layer 106 is deposited to provide physical protection of the features of subsequently formed layers once the carrier substrate is de-bonded, as described further below. Additionally, the protective layer 106 may provide electrical isolation and environmental protection. The protective layer 106 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like; or a combination thereof. The protective layer 106 may be formed, for example, by spin coating, lamination, chemical vapor deposition (CVD), or the like. The protective layer 106 may have an upper surface that is substantially level within process variations.

Figure 3:
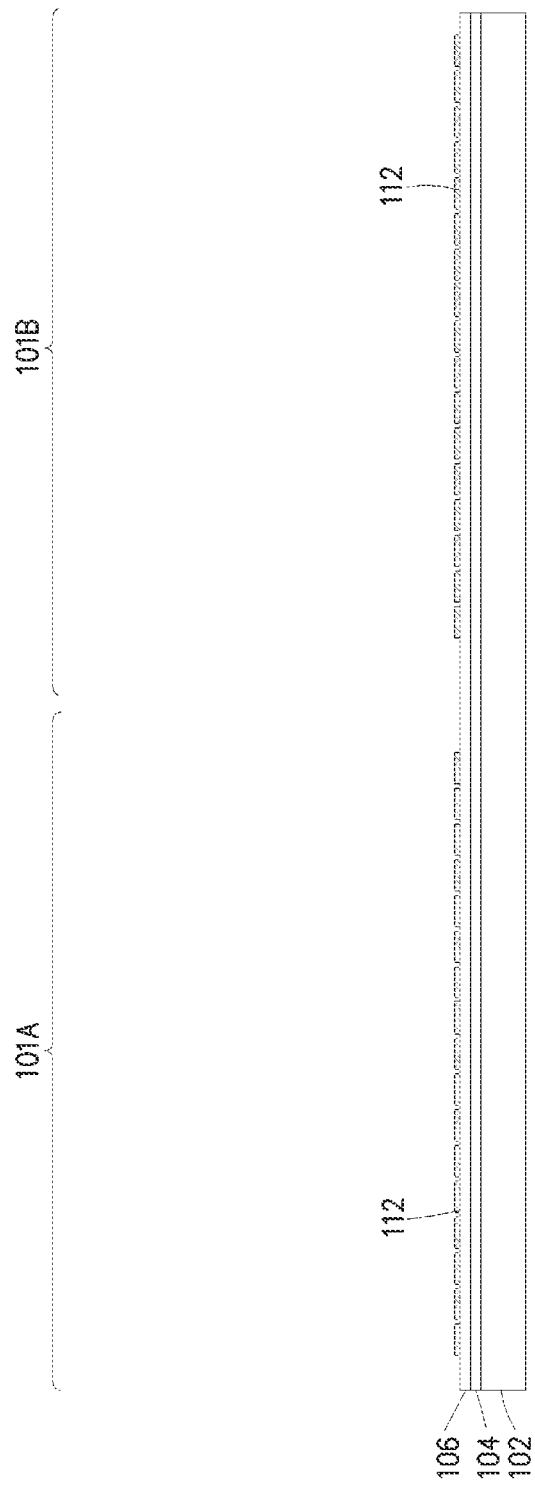

In FIG. 3, conductive lines 112 are formed on the protective layer 106. As an example to form the conductive lines 112, a seed layer (not shown) is formed over the protective layer 106. In some embodiments, the seed layer is a metal layer, which may be a single layer or a composite layer comprising a plurality of sub-layers formed of different materials. The seed layer may be, for example, a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The patterning forms openings through the photoresist to expose the seed layer, where the openings in the photoresist correspond to the conductive lines 112. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the conductive lines 112. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 4:
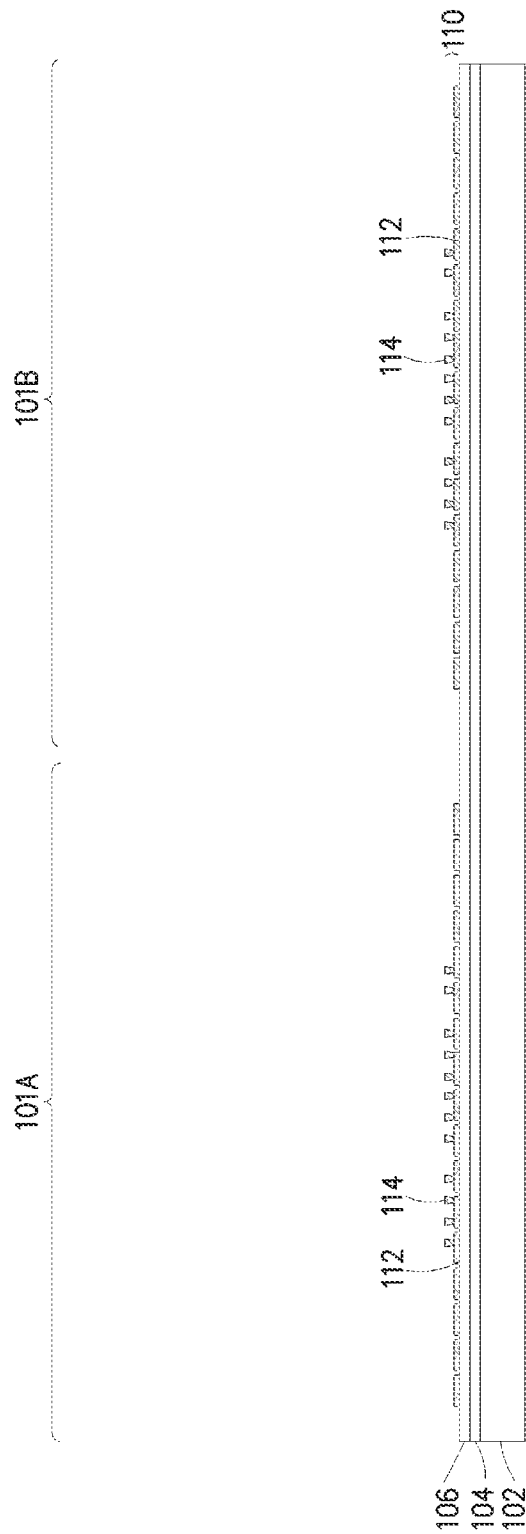

In FIG. 4, conductive vias 114 are formed on and extending from the conductive lines 112. As an example to form the conductive vias 114, a photoresist is formed and patterned over the protective layer 106 and the conductive lines 112. The photoresist may be formed by spin coating or the like and may be exposed to light for patterning. The patterning of the photoresist forms openings through the photoresist to expose portions of the underlying conductive lines 112 such that the openings in the photoresist correspond to the pattern of the conductive vias 114. A conductive material is then formed in the openings of the photoresist and on the exposed portions of the conductive lines 112. The conductive material may be formed by plating, such as electroplating or electroless plating, or the like. The conductive material may comprise a metal, like copper, titanium, tungsten, aluminum, or the like. The photoresist may be removed by an acceptable ashing or stripping process, such as using an oxygen plasma or the like. Conductive lines 112 and conductive vias 114, together, form the metallization pattern for redistribution layer 110.

Figure 5:
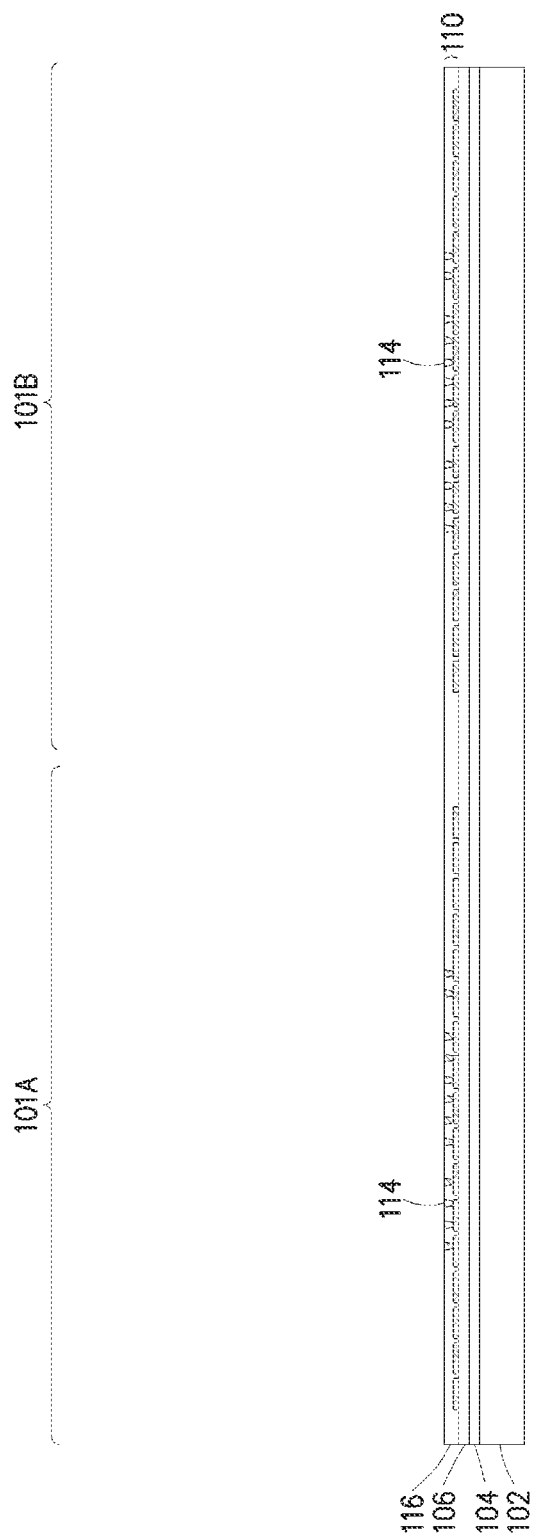

In FIG. 5, a dielectric layer 116 is formed on and around the conductive lines 112 and the conductive vias 114 in accordance with some embodiments. After formation, the dielectric layer 116 surrounds the conductive vias 114 and conductive lines 112. The dielectric layer 116 and metallization pattern, including conductive vias 114 and conductive lines 112, form a redistribution layer 110. In some embodiments, the dielectric layer 116 is an encapsulant, such as a pre-preg, resin coated copper (RCC), molding compound, polyimide, photo-imageable dielectric (PID), epoxy, or the like, and may be applied by compression molding, transfer molding, or the like. The encapsulant may be applied in liquid or semi-liquid form and then subsequently cured. In some embodiments, the dielectric layer 116 is formed over the carrier substrate 102 such that the conductive lines 112 and conductive vias 114 are buried or covered, and a planarization process is then performed on the dielectric layer 116 to expose the conductive vias 114. Topmost surfaces of the dielectric layer 116 and conductive vias 114 are substantially level (e.g., planar) within process variations after the planarization process. The planarization process may be, for example, a chemical-mechanical polish (CMP). In some embodiments, the dielectric layer 116 may comprise other materials, such as silicon oxide, silicon nitride, or the like.

Figure 6:
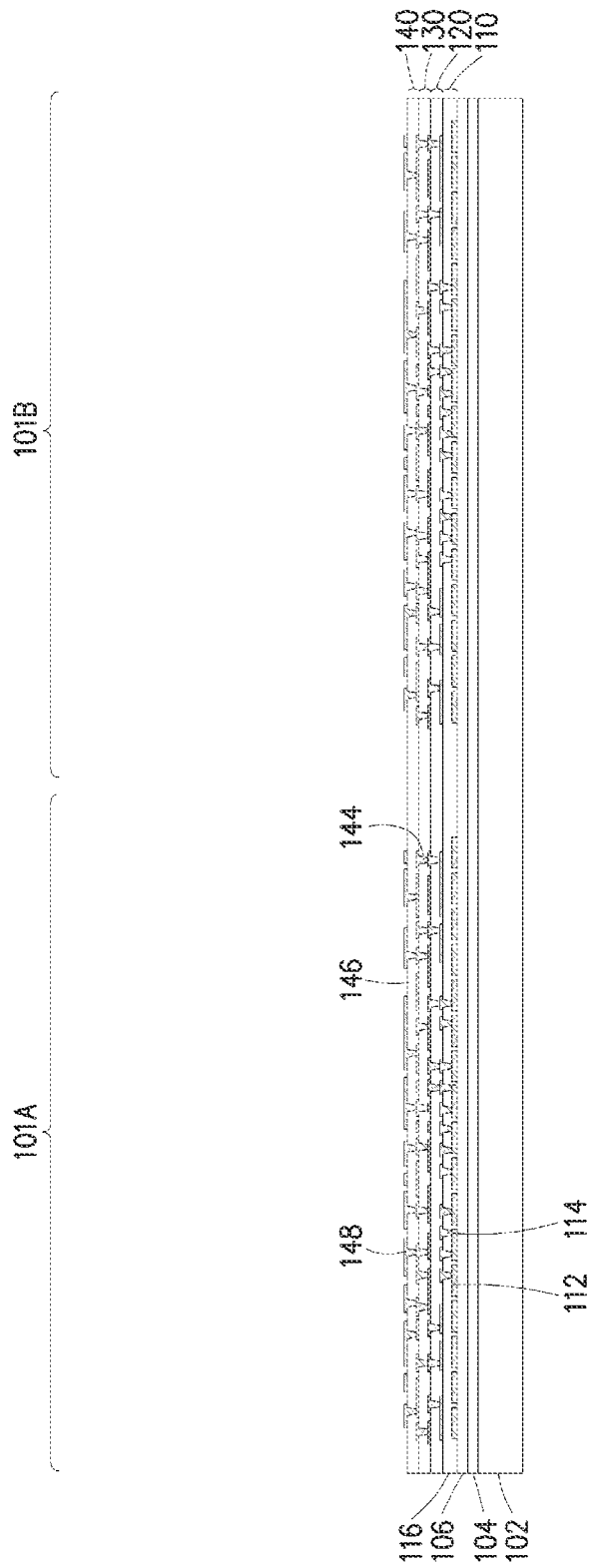
Figure 7:
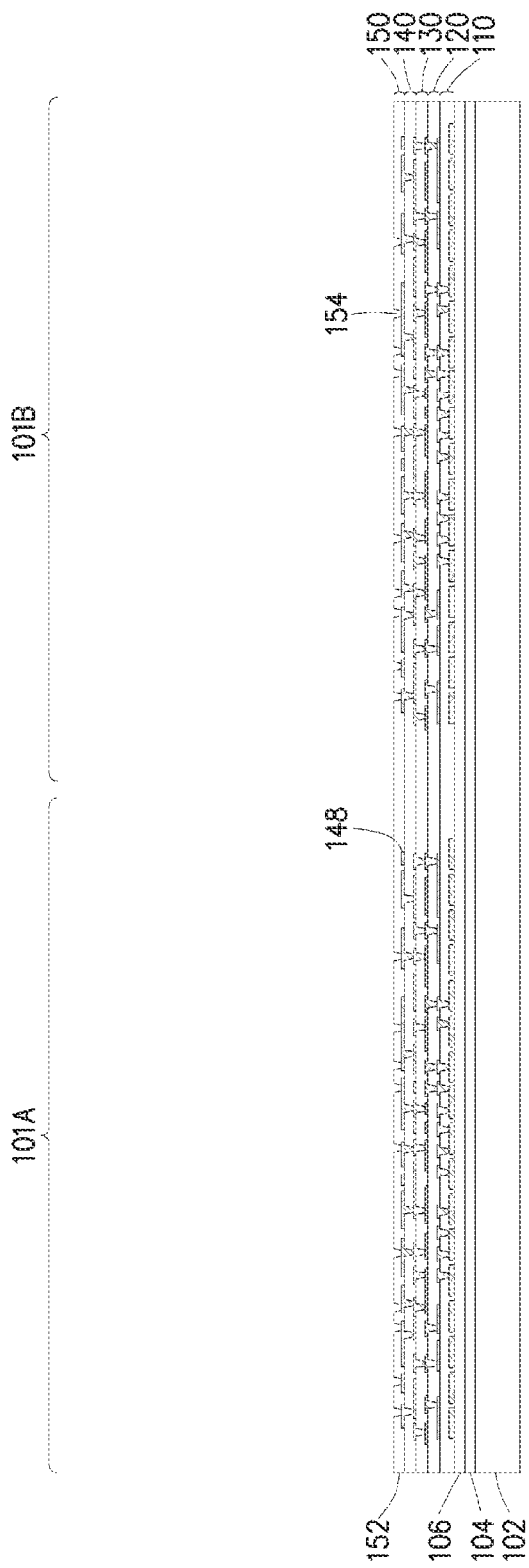

In FIG. 6, the steps and process discussed above are repeated to form additionally shown redistribution layers 120, 130 and 140. In some embodiments, the process described above to form the redistribution layer no may be repeated one or more times to provide additional routing layers as desired for a particular design, wherein conductive lines 112 of the redistribution layer 120 may include routing lines. In some embodiments, the conductive lines 112 in the redistribution layer no comprise pads for an electrical connection, with or without additional routing lines. Four redistribution layers 110, 120, 130 and 140 are shown for illustrative purposes. In some embodiments more than four layers or fewer layers than four may be used. The metallization patterns for each redistribution layer 110, 120, 130, and 140 may have separately formed conductive lines and conductive vias (as shown), or may each be a single pattern having line and via portions.

In some embodiments, an additional set of conductive lines 148 are formed over each conductive via 144 and portion of the dielectric layer 116 of the uppermost redistribution layer, e.g., the redistribution layer 140 in the illustrated embodiment. This additional set of conductive lines 148 provides a larger dimensional footprint for connecting further metallization patterns as discussed below.

Where encapsulant and a subsequent CMP process is used to planarize redistribution layers 110, 120, 130, and 140, the dimensions, and roughness of the associated layers can be well controlled and more easily built up to larger thicknesses. In some embodiments, the thickness of redistribution layers 110, 120, 130, and 140 is each between 2 micrometers (μm) and 100 μm. More or fewer redistribution layers may be formed by, respectively, repeating or omitting the steps and process discussed above.

In redistribution layers where longer linear lengths of connection are not needed, thinner and more compact redistribution layers may be included in the first redistribution structure that are formed from using different fabrication methods and materials. Additionally, more dense design rules may be managed in such layers using photomasks or PID materials. For example, in FIG. 7, a redistribution layer 150 is included utilizing different design processes and parameters than those used in redistribution layers 110, 120, 130, and 140. For example, in the embodiment shown in FIG. 7, a dielectric layer 152 is formed on redistribution layer 140 and conductive lines 148. In some embodiments, the dielectric layer 152 is formed of a photosensitive material such as PBO, polyimide, BCB, or the like, which may be patterned using a lithography process. The dielectric layer 152 may be formed by spin coating, lamination, CVD, the like, or a combination thereof. The dielectric layer 152 is then patterned to form openings 154, exposing portions of the conductive lines 148. The patterning may be by an acceptable process, such as by exposing to light and developing the dielectric layer 152 when the dielectric layer 152 is a photosensitive material or by etching using, for example, an anisotropic etch when the dielectric layer 152 is not photosensitive.

Figure 8:
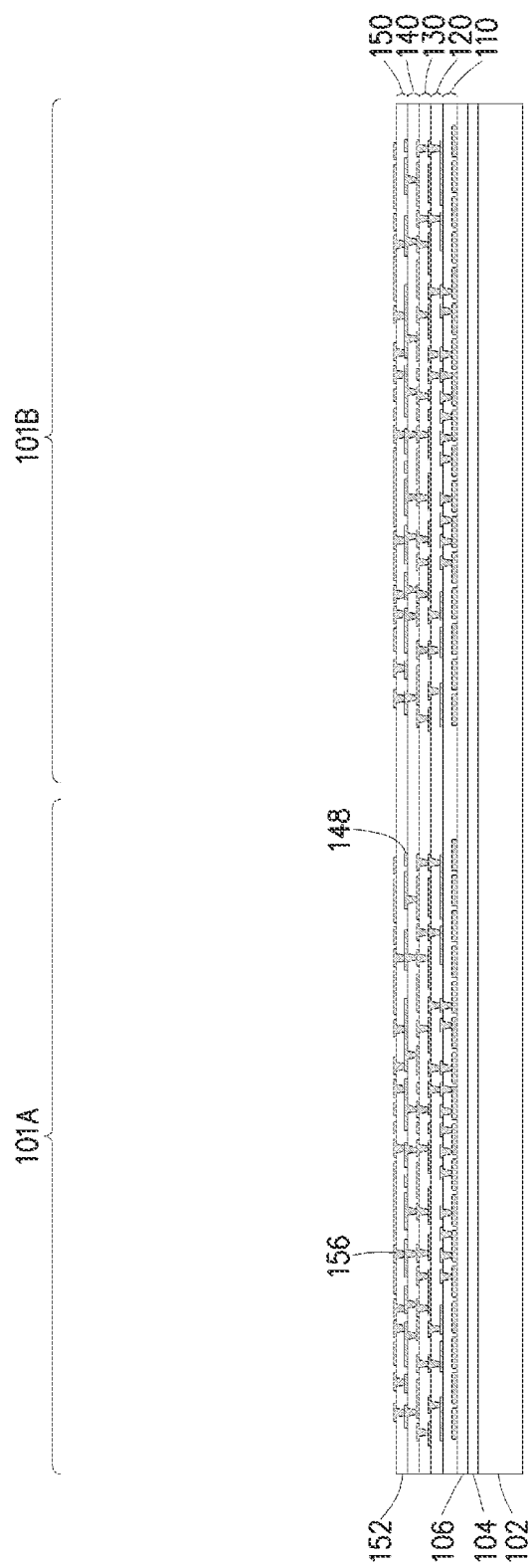

In FIG. 8, the metallization pattern 156 is then formed. The metallization pattern 156 includes conductive elements extending along the major surface of the dielectric layer 152 and extending through the dielectric layer 152 to physically and electrically couple to an underlying conductive layer, e.g., the conductive lines 148 in this illustrated embodiment. As an example to form the metallization pattern 156, a seed layer is formed over the dielectric layer 152 and in the openings extending through the dielectric layer 152 to conductive lines 148. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light and developed for patterning. The patterning forms openings through the photoresist to expose the seed layer, with the pattern of the openings corresponding to the metallization pattern 156. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 156. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The combination of the dielectric layer 152 and the metallization pattern 156 form the redistribution layer 150.

Figure 9:
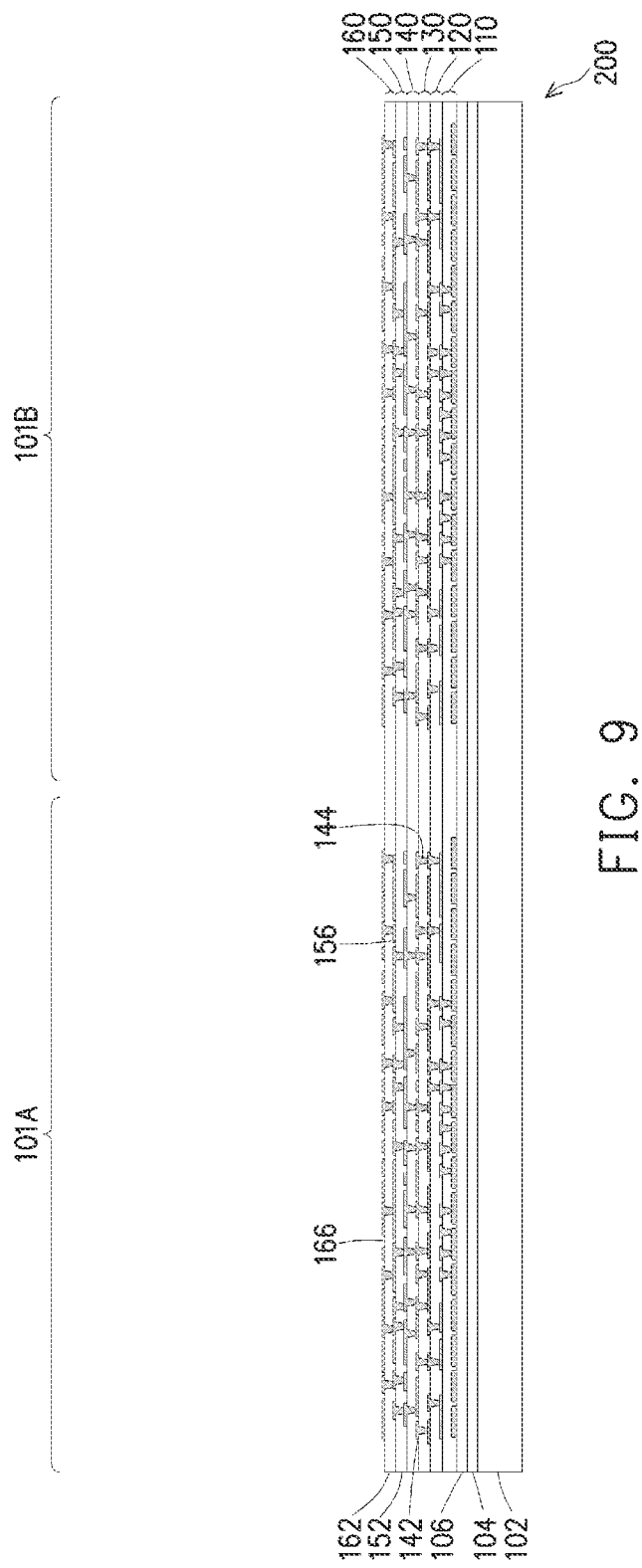

In FIG. 9, a redistribution layer 160 is formed over the redistribution layer 150. The redistribution layer 160 may be formed of similar materials using similar processes as those discussed above with reference to the redistribution layer 150. FIG. 9 illustrates two redistribution layers 150 and 160 formed using thinner dielectrics than redistribution layers 110, 120, 130, and 140. In some embodiments, redistribution layers 150 and 160 are each between 2 μm and 15 μm thick. More or fewer layers of thinner dielectric similar to redistribution layers 150 and 160 may be formed in the first redistribution structure 200.

The first redistribution structure 200 includes protective layer 106 and redistribution layers 110, 120, 130, 140, 150, and 160. Redistribution layers 110, 120, 130, 140, 150, and 160 include both metallization patterns and dielectric layers. The metallization patterns may also be referred to as redistribution lines. The first redistribution structure 200 is shown as an example having six redistribution layers. More or fewer layers may be formed in the first redistribution structure 200. If fewer layers are to be formed, steps and process discussed above may be omitted. If more layers are to be formed, steps and processes discussed above may be repeated. In some embodiments, the first redistribution structure 200 includes between 1 and 20 layers.

In some embodiments, the metallization patterns 156 and 166 of redistribution layers 150, 160 have a different size than the metallization patterns of redistribution layers 110, 120, 130, and 140, and the dielectric layers 152 and 162 of redistribution layers 150, 160 are thinner than the dielectric layers of redistribution layers 110, 120, 130, and 140. For example, the conductive lines 142 and/or conductive vias 144 of the metallization pattern of redistribution layer 140 may be wider or thicker than the conductive lines and/or vias of the metallization pattern 166 and 156, thereby allowing for longer horizontal routing.

In some embodiments, longer linear electrical pathways are formed in redistribution layers 110, 120, 130, and 140 using thicker and/or wider metallization dimensions, while redistribution layers 150 and 160 have overall shorter linear electrical pathways. As discussed above, the dielectric layers of redistribution layers closer to the carrier substrate 102 (e.g., redistribution layers 110, 120, 130, and 140 in FIG. 9) are formed using an encapsulant and subsequently planarized with a CMP process, while further redistribution layers further from the carrier substrate 102 (e.g., redistribution layers 150 and 160 in FIG. 9) are fabricated using photosensitive materials that are patterned using a lithography process. In such embodiments, the roughness of the planarized layers (e.g., e.g., redistribution layers 110, 120, 130, and 140 in FIG. 9) can be well controlled and more easily built up to larger thicknesses. In such a case, thicker and wider metallization dimensions may be utilized in the planarized layers to decrease the overall impedance of metallization pathways per unit length—thus improving circuit efficiency and/or reducing heat generation and power consumption. For example, circuit loads may be reduced for the same linear length of a given metallization pathway by increasing the thickness and/or width of the metallization pattern, thus increasing efficiency and while reducing power consumption and heat generation. Larger overall package dimensions may be achieved with the same or similar circuit design by extending metallization pathways horizontally with thicker and/or wider metallization pathways.

Figure 10:
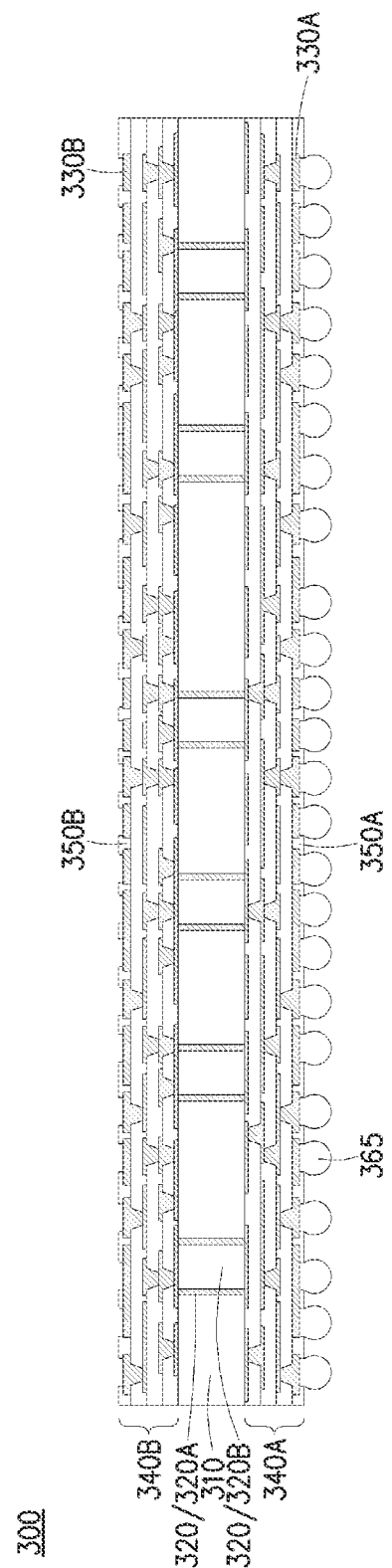
Figure 11:
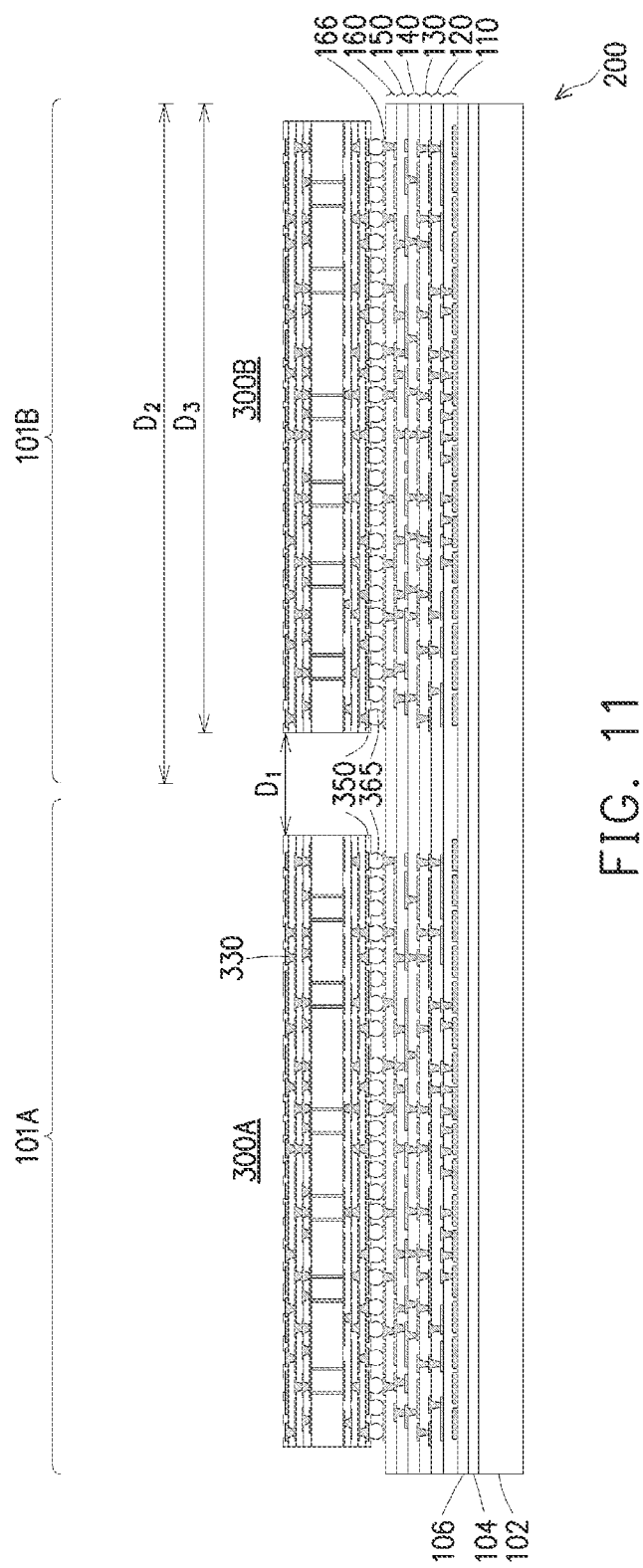

In FIG. 10, a core substrate 300 is illustrated and, in FIG. 11, is bonded to a redistribution structure, such as the first redistribution structure 200 in this example. Utilizing the core substrate 300 has the advantage of having the core substrate 300 being manufactured in a separate process. In addition, because core substrate 300 is formed in a separate process, it can be tested separately so that a known good core substrate 300 is used. For example, in some embodiments, the core substrate 300 may be individually or batch tested, validated, and/or verified prior to bonding the core substrate 300 to the first redistribution structure 200.

The core substrate 300 may be, e.g., an organic substrate, a ceramic substrate, a silicon substrate, or the like. Conductive connectors 365 are used to attach the core substrate 300 to the first redistribution structure 200. Attaching the core substrate 300 may include placing the core substrate 300 on the first redistribution structure 200 and reflowing the conductive connectors 365 to physically and electrically couple the core substrate 300 and the first redistribution structure 200.

Before being attached, to the first redistribution structure 200 the core substrate 300 may be processed according to applicable manufacturing processes to form redistribution structures in the core substrate 300. For example, the core substrate 300 includes a core 310. The core 310 may be formed of one or more layers of glass fiber, resin, filler, pre-preg, epoxy, silica filler, ABF, polyimide, molding compound, other materials, and/or combinations thereof. In some embodiments, for example, two layers of material make up the core 310. The core 310 may be formed of organic and/or inorganic materials. In some embodiments, the core 310 includes one or more passive components (not shown) embedded inside. The core 310 may comprise other materials or components. Conductive vias 320 are formed extending through the core 310. The conductive vias 320 comprise a conductive material 320A such as copper, a copper alloy, or other conductors, and may include a barrier layer (not shown), liner (not shown), seed layer (not shown), and/or a fill material 32013, in some embodiments. The conductive vias 320 provide vertical electrical connections from one side of the core 310 to the other side of the core 310. For example, some of the conductive vias 320 are coupled between conductive features at one side of the core 310 and conductive features at an opposite side of the core 310. Holes for the conductive vias 320 may be formed using a drilling process, photolithography, a laser process, or other methods, as examples, and the holes of the conductive vias 320 are then filled or plated with conductive material. In some embodiments, the conductive vias 320 are hollow conductive through vias having centers that are filled with an insulating material. Redistribution structures 340A and 340B are formed on opposing sides of the core 310. The redistribution structures 340A and 340B are electrically coupled by the conductive vias 320, and fan-in/fan-out electrical signals.

The redistribution structures 340A and 340B each include dielectric layers, formed of ABF, pre-preg, or the like, and metallization patterns. Each respective metallization pattern has line portions on and extending along a major surface of a respective dielectric layer, and has via portions extending through the respective dielectric layer. The redistribution structures 340A and 340B each, respectively, include under-bump metallurgies (UBMs) 330A and 330B for external connection, and solder resists 350A and 350B protecting the features of the redistribution structures 340A and 340B. The redistribution structure 340A is attached to the first redistribution structure 200 by the UBMs 330A through the conductive connectors 365 as illustrated in FIG. 11. More or fewer dielectric layers and metallization patterns may be formed in the redistribution structures 340A and 340B than shown in FIG. 11.

The core substrate 300 may include active and passive devices (not shown), or may be free from either active devices, passive devices, or both. A wide variety of devices such as transistors, capacitors, resistors, combinations of these, and the like may be used. The devices may be formed using any suitable methods.

In some embodiments, the core substrate 300 comprises between 2 and 10 complete layers of material. In the embodiment shown, the core substrate 300 includes 3 top redistribution layers in redistribution structure 340B, 2 layers of substrate material in core 310, and 3 bottom redistribution layers in redistribution structure 340A.

Conductive connectors 365 may be used to bond the core substrates 300A and 300B to the first redistribution structure 200 as illustrated in Figure ii. The conductive connectors 365 may be first formed on either the core substrates 300A and 300B, or the first redistribution structure 200, and then reflowed to complete the bond. For example, in the embodiment shown in FIG. 10, conductive connectors 365 are formed on UBMs 330A of the bottom redistribution structure 340A with a pitch between 150 µm and 1000 µm. The conductive connectors 365 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 365 may include a conductive material such as solder, copper, aluminum, gold, nickel, silver, palladium, tin, the like, or a combination thereof. In some embodiments, the conductive connectors 365 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 365 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

In FIG. 11, core substrates 300A and 300B are bonded to the first redistribution structure 200 (see, e.g., FIG. 9) in first package region 101A and second package region 101B, respectively. In some embodiments, the core substrate 300A is separated from the adjacent core substrate 300B by a distance D1 between about 25 µm and about 1,000 µm. This distance provides space between a first package region 101A and a second package region 101B for singulation of the first redistribution structure 200 into separate packages in a subsequent process. In embodiments such as that illustrated in FIG. 11, dimensions D3 of the core substrates 300A and 300B is less than the dimensions of the first package region 101A and second package region 101B D2, respectively to allow for encapsulation and singulation without damaging the core substrates 300A and 300B. In some embodiments, a standoff height of 20 µm to 500 µm is utilized between the core substrates 300A and 300B and the first redistribution structure 200.

In some embodiments, the core substrates 300A and 300B may be placed on the first redistribution structure 200 using a pick and place process or another suitable process and the conductive connectors 365 bonded by flip chip bonding process or other suitable bonding process. In some embodiments, the conductive connectors 365 are reflowed to attach the core substrates 300A and 300B to the first redistribution structure 200 by way of metallization pattern 166. The conductive connectors 365 electrically and/or physically couple the core substrates 300A and 300B to the first redistribution structure 200.

The conductive connectors 365 may have an epoxy flux (not shown) formed thereon before they are reflowed with at least some of the epoxy portion of the epoxy flux remaining after the core substrates 300A and 300B are attached to the first redistribution structure 200.

In some embodiments, passive devices (e.g., surface mount devices (SMDs), not illustrated) may also be attached to the first redistribution structure 200 (e.g., to the contact pads formed in metallization pattern 166) or to the core substrates 300A and 300B (e.g., to UBMs 330). The passive devices may be attached to the first redistribution structure 200 prior to attaching the core substrates 300A and 300B, or may be attached after mounting the core substrates 300A and 300B to the first redistribution structure 200.

Figure 12:
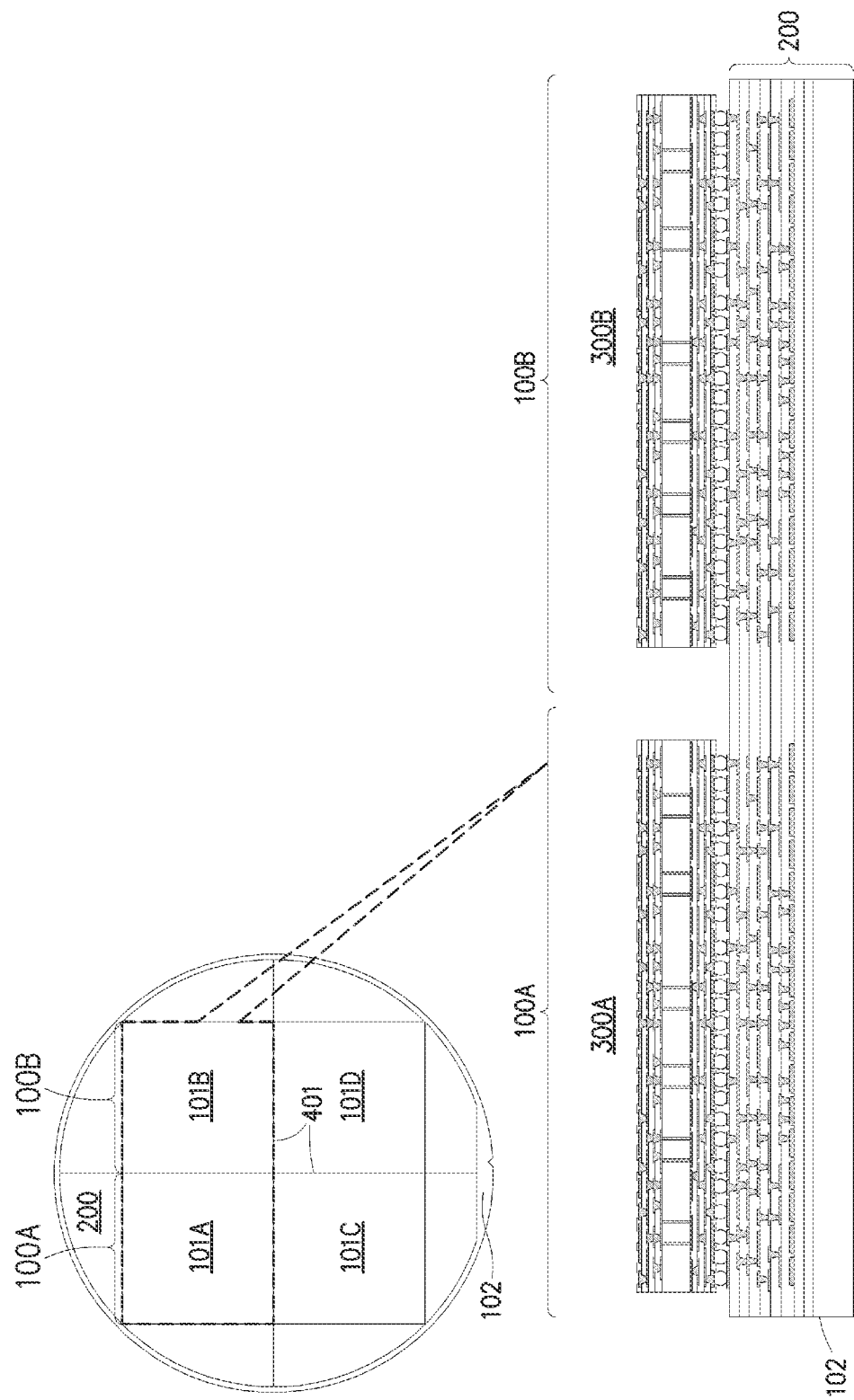
FIG. 12 illustrates a planar view of the layout of package regions on a wafer substrate in accordance with some embodiments.

As discussed above, the first redistribution structure 200 may be larger and include multiple package regions, such as the first package region 101A and second package region 101B. For example, FIG. 12 illustrates the first redistribution structure 200 having a circular wafer shape with multiple package regions. In the embodiment shown, four package regions 101A, 101B, 101C, and 101D are included on the wafer allowing for four final package components to be fabricated on a single wafer and later singulated. Fewer or more package regions may be utilized on a single wafer in other embodiments. Subsequent steps in the process use the first redistribution structure 200 on a wafer form carrier substrate 102 as the base upon which to continue the fabrication process described in further detail below. As described in further detail below, the individual package regions are singulated by sawing along lines 401 and around the outer edges of package regions 101A, 101B, 101C, and 101D.

Figure 13:
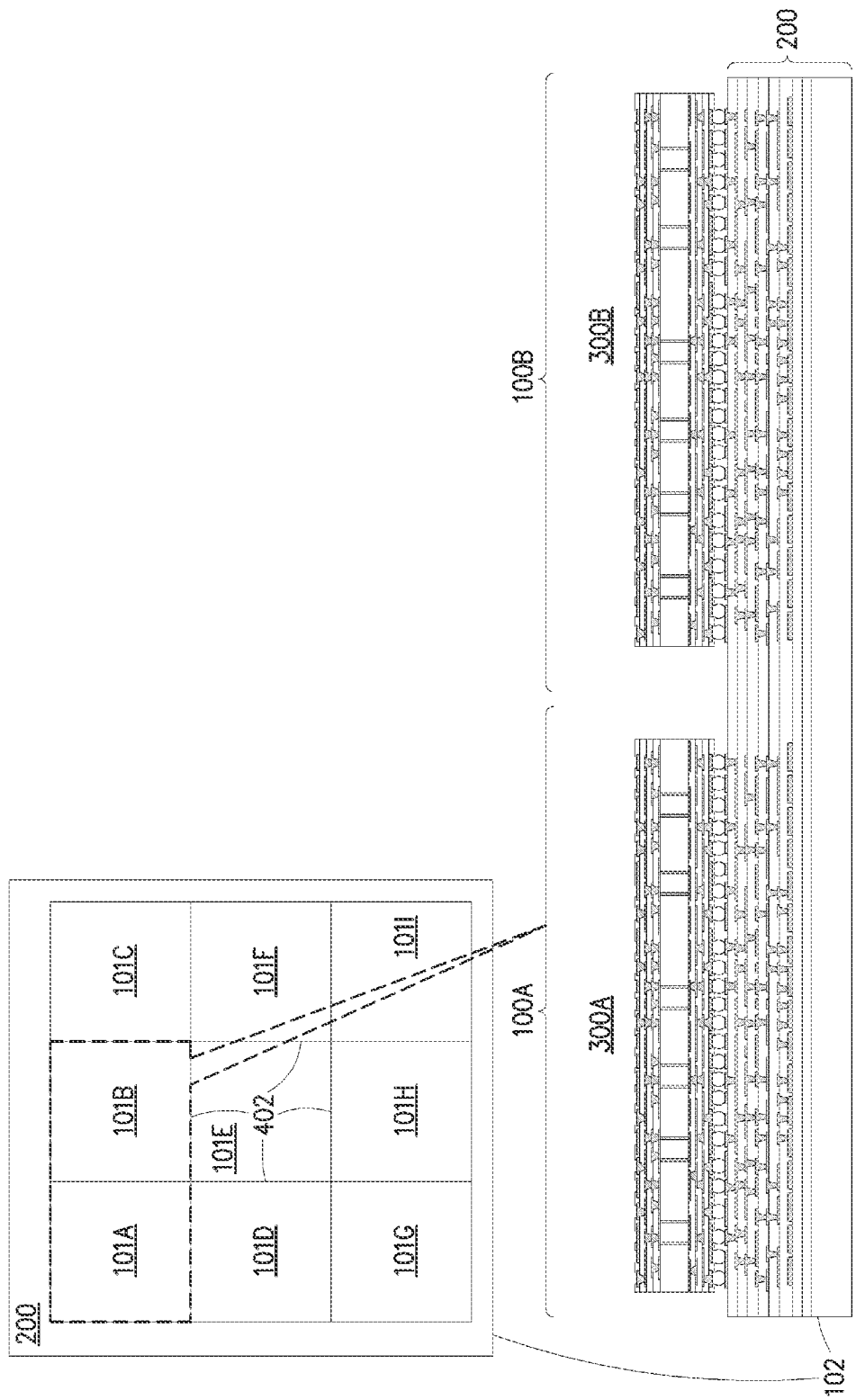
FIG. 13 illustrates a planar view of the layout of package regions on a panel substrate in accordance with some embodiments.

FIG. 13 illustrates the first redistribution structure 200 being manufactured using a panel form fabrication process with multiple package regions. In the embodiment shown, nine package regions 101A through 101I are included on the wafer allowing for nine final package components to be fabricated on a single wafer or panel. Fewer or more package regions may be utilized on a single wafer or panel in other embodiments. Subsequent steps in the process use the first redistribution structure 200 on a panel form carrier substrate 102 as the base upon which to continue the fabrication process described in further detail below. As described in further detail below, the individual package regions are singulated by sawing along lines 402 and around the perimeter of package regions 101A through 101I.

Figure 14:
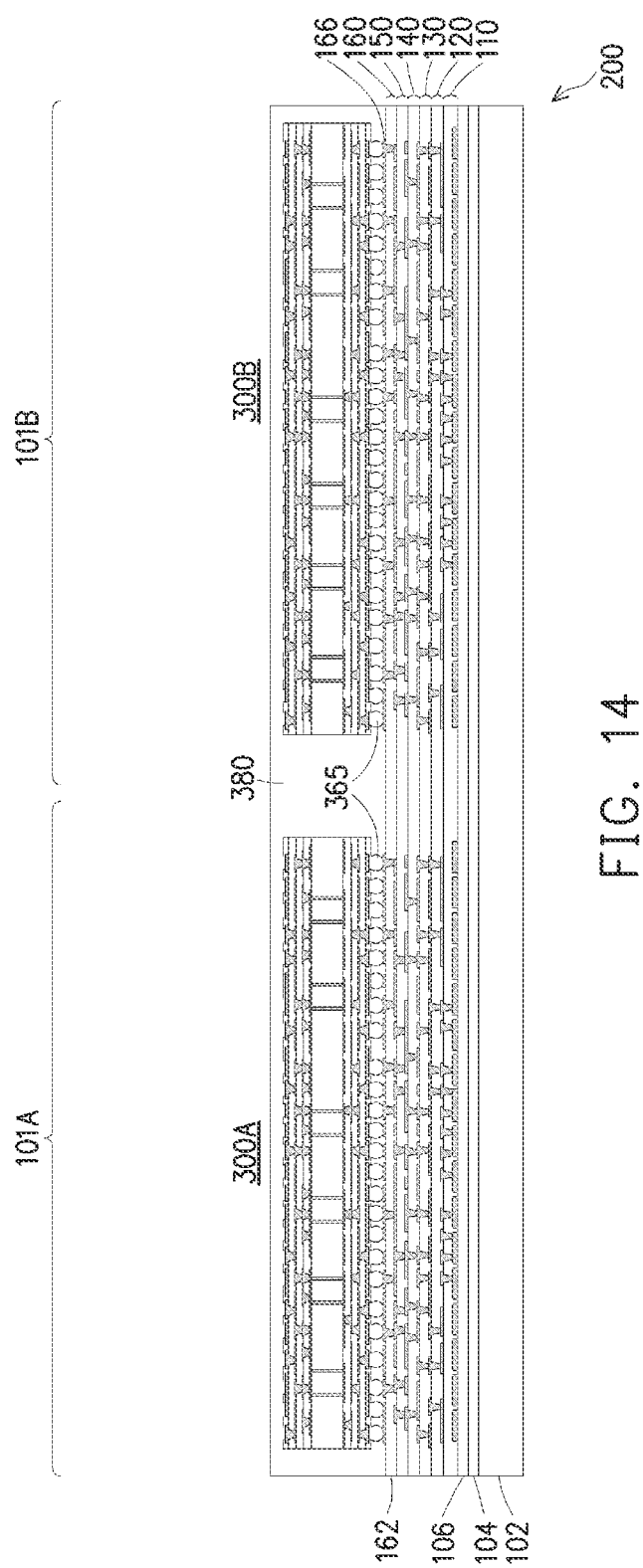

In FIG. 14, a first under fill is performed by forming encapsulant 380 on and around the various components. After formation, the encapsulant 380 surrounds the core substrates 300A and 300B, including conductive connectors 365, metallization pattern 166, and the upper exposed surface of dielectric layer 162. The encapsulant 380 may be formed of a molding compound, epoxy, or the like, and may be applied by compression molding, transfer molding, or the like. The encapsulant 380 may be applied in liquid or semi-liquid form and then subsequently cured. The encapsulant 380 may be formed over the carrier substrate 102 such that core substrates 300A and 300B are buried or covered.

Figure 15:
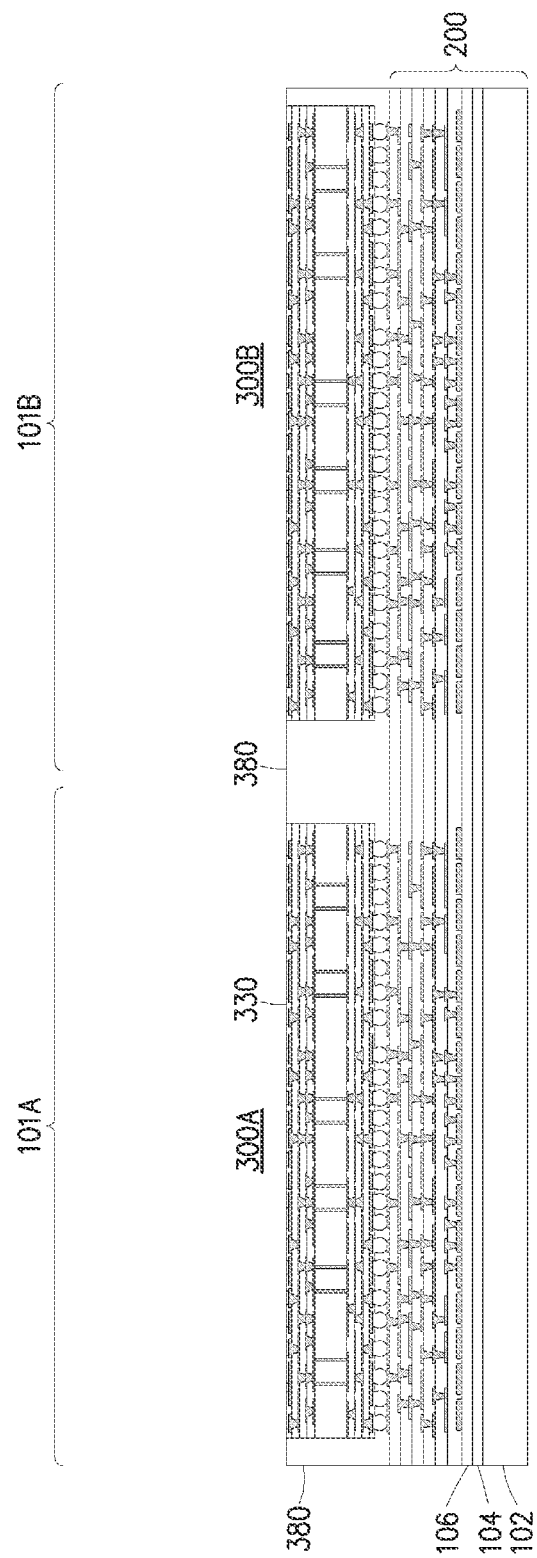

In FIG. 15, a planarization process may be performed, if necessary, on the encapsulant 380 to expose the UBMs 330 of the core substrates 300A and 300B. Topmost surfaces of the encapsulant 380 and UBMs 330 are substantially level (e.g., planar) after the planarization process within process variations. The planarization process may be, for example, a chemical-mechanical polish (CMP), a grinding process, or the like. In some embodiments, the planarization may be omitted, for example, if the UBMs 330 are already exposed. Other processes may be used to achieve a similar result. For example, a dielectric or passivation layer may be formed over UBMs 330 prior to forming the encapsulant 380. In such cases, the dielectric or passivation layer may be patterned in a subsequent step to expose portions of the UBMs 330.

Figure 16:
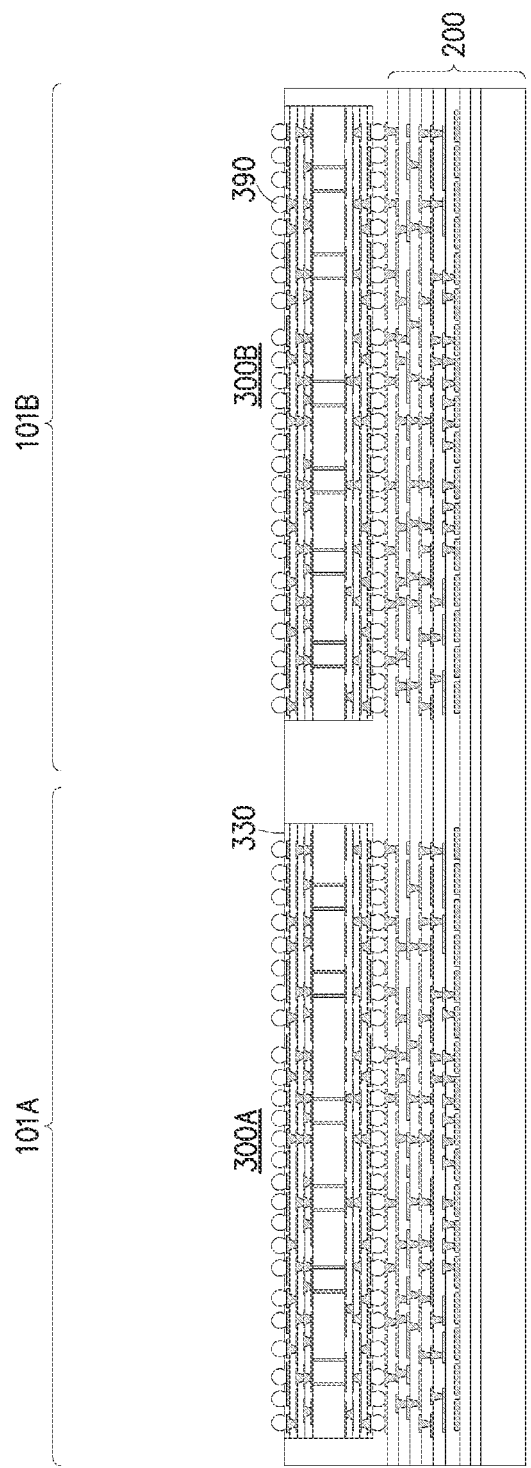

Conductive connectors may be used to bond the core substrates 300A and 300B to the second redistribution structure 500. For example, in the embodiment shown in FIG. 16, conductive connectors 390 are formed on the UBMs 330 in core substrates 300A and 300B. The conductive connectors 390 may be ball grid array (BGA) connectors (as shown), solder balls, metal pillars, controlled collapse chip connection (C4) bumps, micro bumps, electroless nickel-electroless palladium-immersion gold technique (ENEPIG) formed bumps, or the like. The conductive connectors 390 may include a conductive material such as solder, copper, aluminum, gold, nickel, silver, palladium, tin, the like, or a combination thereof. In some embodiments, the conductive connectors 390 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 390 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. The conductive connectors 390 may be first formed on the core substrates 300A and 300B as illustrated in FIG. 16, or optionally formed on the second redistribution structure 500 (see FIG. 17), and then reflowed to complete the bond.

Figure 17:
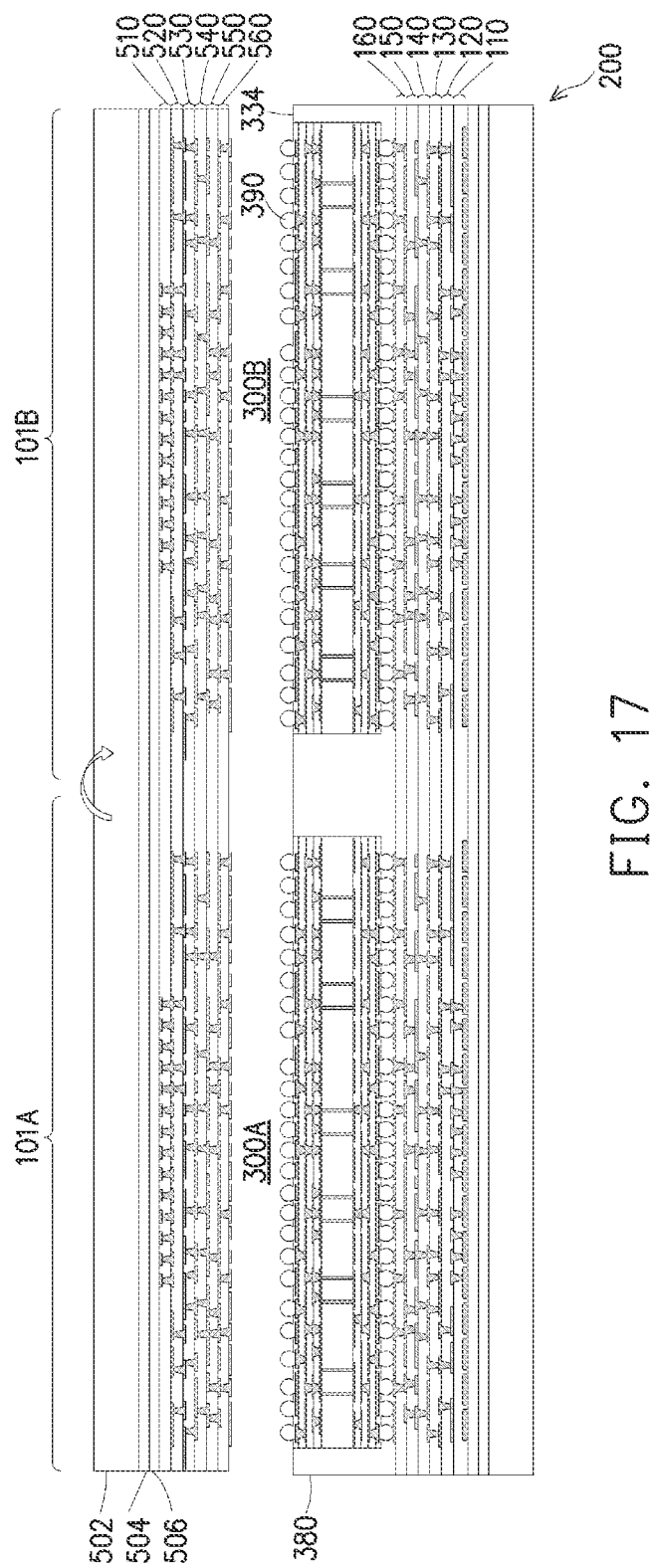

In FIG. 17, a second redistribution structure 500, which may be formed in a similar manner as the first redistribution structure 200 described in FIGS. 2 through 9, is provided. In some embodiments, the second redistribution structure 500 is symmetrical to the first redistribution structure 200 in that it contains a similar number and type of layers as first redistribution structure 200. In some embodiments, the second redistribution structure 500 has the same type of layers, formed by the same materials, in the same manner, and in the same order when viewed from the core substrate 300, as the first redistribution structure 200.

Figure 18:
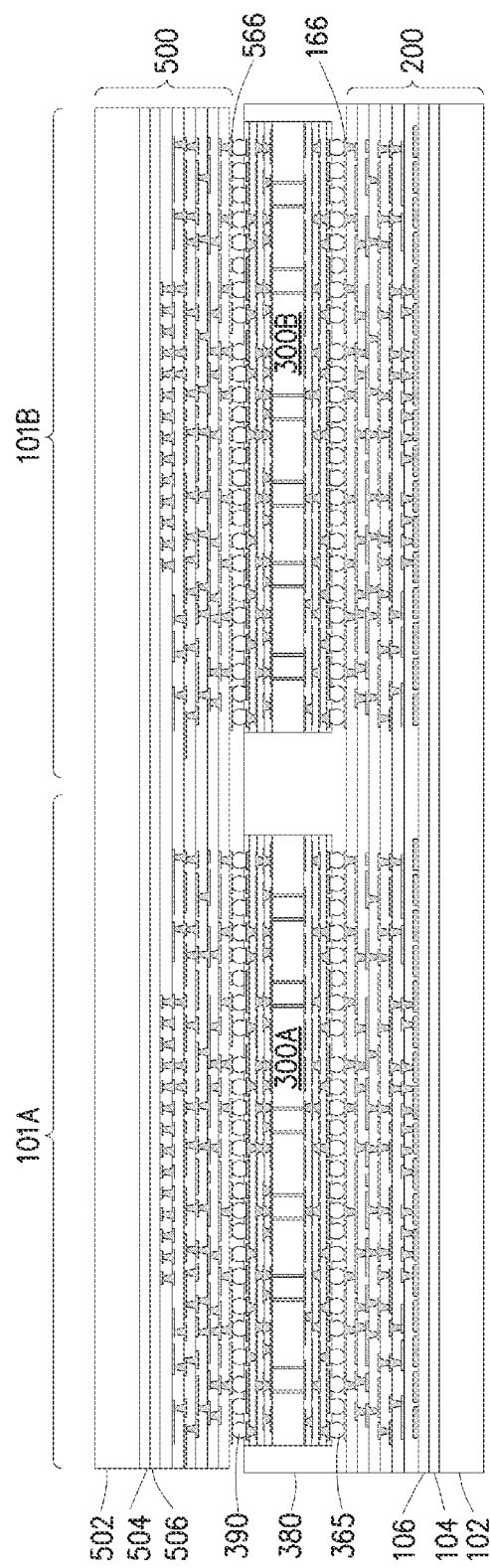

For example, with respect to the embodiment illustrated in FIG. 17, the second redistribution structure 500 contains the same types of layers, symmetrically situated to the core substrates 300A and 300B (as shown in FIG. 18), as the first redistribution structure 200. In some embodiments, release layer 504 is formed of the same or similar materials, and using the same or similar processes, as release layer 104. In some embodiments, protective layer 506 of the second redistribution structure 500 is formed of the same or similar materials, and using the same or similar processes, as protective layer 106 of the first redistribution structure 200. In some embodiments, redistribution layers 510, 520, 530, and 540 of the second redistribution structure 500 are formed of the same or similar materials and using the same or similar processes, as redistribution layers 110, 120, 130, and 140 of the first redistribution structure 200. The patterns of metallization and dielectrics in redistribution layers 510, 520, 530, and 540 need not exactly mirror the layouts used in redistribution layers 110, 120, 130, and 140 of the first redistribution structure 200. For example, as shown in FIG. 17, the metallization pattern of redistribution layer 510 includes different metallization patterns than those shown in redistribution layer no to achieve different electrical connection layouts on the top and bottom of the package component.

In some embodiments, redistribution layers 550 and 560 of the second redistribution structure 500 are formed of the same or similar materials and using the same or similar processes as redistribution layers 150 and 160 of the first redistribution structure 200. The patterns of metallization and dielectrics in redistribution layers 550 and 560 need not exactly mirror patterns used in redistribution layers 150 and 160 of the first redistribution structure 200, and are dependent on the design requirements of the final package component and the structures of core substrates 300A and 300B.

After fabrication, the second redistribution structure 500 is flipped over and aligned with the existing buildup of the package component 100, comprising the first redistribution structure 200, core substrates 300A and 300B, and encapsulant 380.

In the embodiment shown in FIG. 17, the second redistribution structure 500 encompasses an entire wafer or panel such that the first redistribution structure 200 and the second redistribution structure 500 are coupled as singular structures. In some embodiments the second redistribution structure 500 may be singulated prior to its integration into the package component 100 and may be placed on the existing buildup of the package component 100 shown in FIG. 17 using a pick and place process or another suitable process.

In FIG. 18, the second redistribution structure 500 is bonded to the top of core substrates 300A and 300B. In some embodiments, the conductive connectors 390 are reflowed to attach the core substrates 300A and 300B to the second redistribution structure 500 by way of metallization pattern 566. The conductive connectors 390 electrically and/or physically couple the core substrates 300A and 300B to the second redistribution structure 500. A standoff height of 20 µm to 500 µm is maintained between the core substrates 300A and 300B and the second redistribution structure 500.

The conductive connectors 390 may have an epoxy flux (not shown) formed thereon before they are reflowed with at least some of the epoxy portion of the epoxy flux remaining after the core substrates 300A and 300B are attached to the second redistribution structure 500.

In some embodiments, passive devices (e.g., surface mount devices (SMDs), not illustrated) may also be attached to the second redistribution structure 500 (e.g., to metallization pattern 566), or to the tops of the core substrates 300A and 300B (e.g., to conductive connectors 390).

Figure 19:
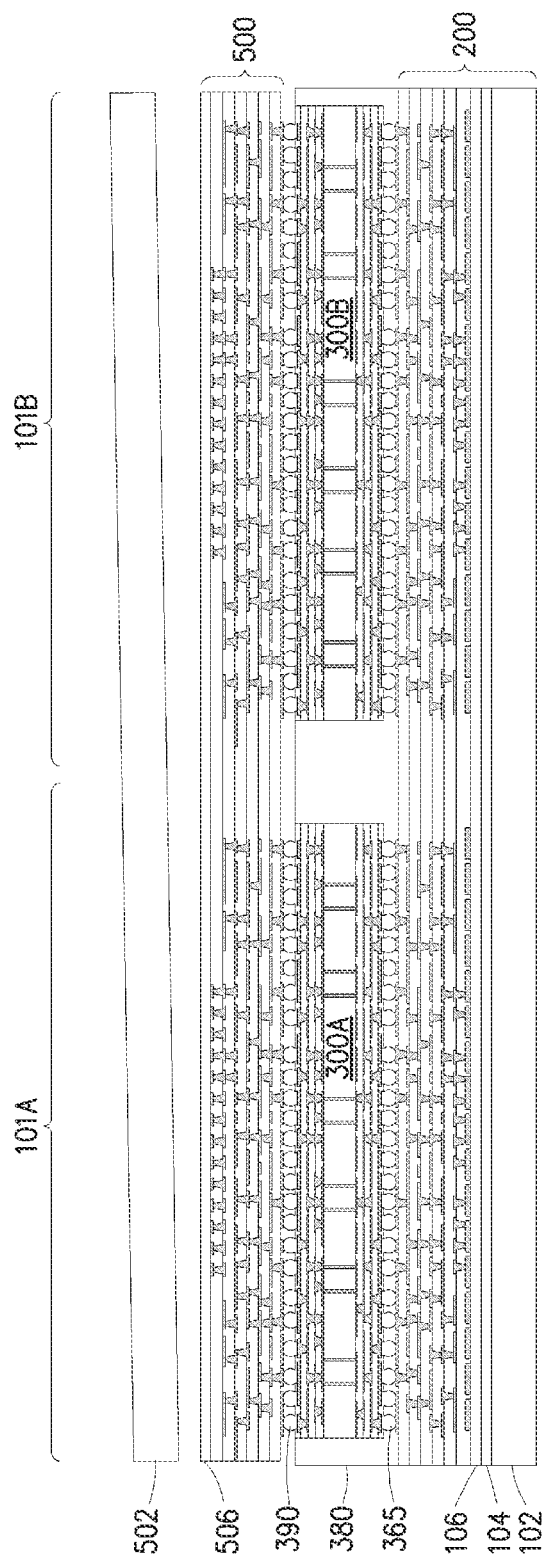

In FIG. 19, a carrier substrate de-bonding is performed to detach (or "de-bond") the carrier substrate 502 from the second redistribution structure 500. In accordance with some embodiments, the de-bonding includes projecting a light such as a laser light or an UV light on the release layer 504 (see FIG. 19) so that the release layer 504 decomposes under the heat of the light and the carrier substrate 502 can be removed.

Figure 20:
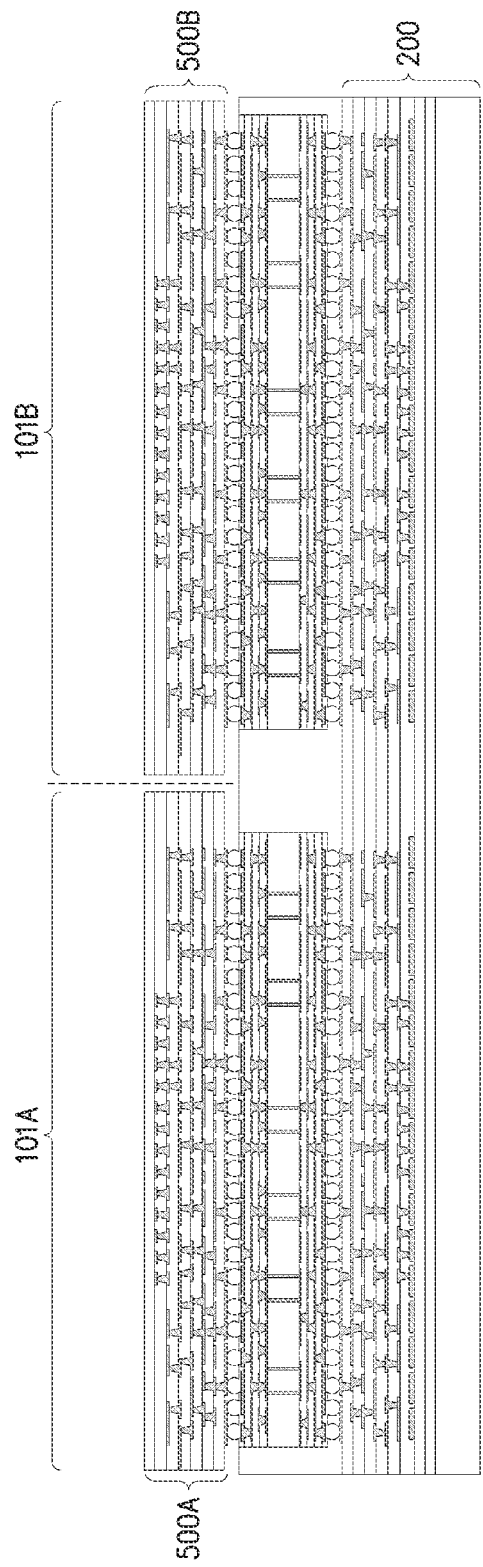

In some embodiments, as shown in FIG. 20, the de-bonded second redistribution structure 500 (see FIG. 19) is singulated after the de-bonding process by sawing along scribe line regions, e.g., around the first package region 101A and second package region 101B. The sawing singulates the first package region 101A from adjacent package regions, including second package region 101B (shown) and results in singulated second redistribution structures 500A and 500B that are smaller than the first package region 101A and second package region 101B, respectively.

Figure 21:
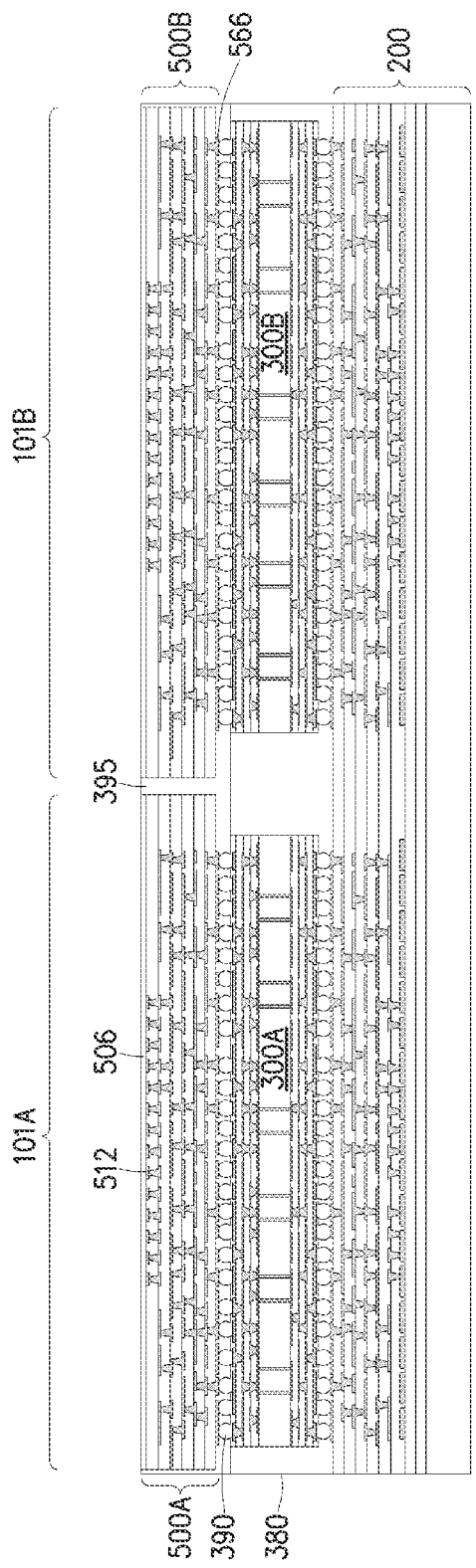

In FIG. 21, a second underfill process is performed by forming encapsulant 395 on and around the various components. After formation, the encapsulant 395 surrounds the core substrates 300A and 300B, conductive connectors 390, singulated second redistribution structures 500A and 500B, and the remaining exposed portions of the first underfill (comprising encapsulant 380). The encapsulant 395 may be formed of a molding compound, epoxy, or the like, and may be applied by compression molding, transfer molding, or the like. The encapsulant 395 may be applied in liquid or semi-liquid form and then subsequently cured.

In the case where the second redistribution structure 500 is singulated prior its integration, or where the singulation occurs as shown in the embodiment of FIG. 20, the encapsulant 395 may be formed over the core substrates 300A and 300B, and the first underfill (comprising encapsulant 380). The encapsulant 395 may also exist on the side of, and between, the singulated second redistribution structures 500A and 500B as shown in FIG. 21. In the case where the second redistribution structure 500 is buried or covered, a planarization process may then be performed on the encapsulant 395 to expose the protective layer 506 and/or conductive lines 512. Topmost surfaces of the encapsulant 395 and protective layer 506 (or conductive lines 512) are substantially level within process variations after the planarization process. The planarization process may be, for example, a chemical-mechanical polish (CMP), a grinding process, or the like. In some embodiments, the planarization may be omitted. Other processes may be used to achieve a similar result.

Figure 22:
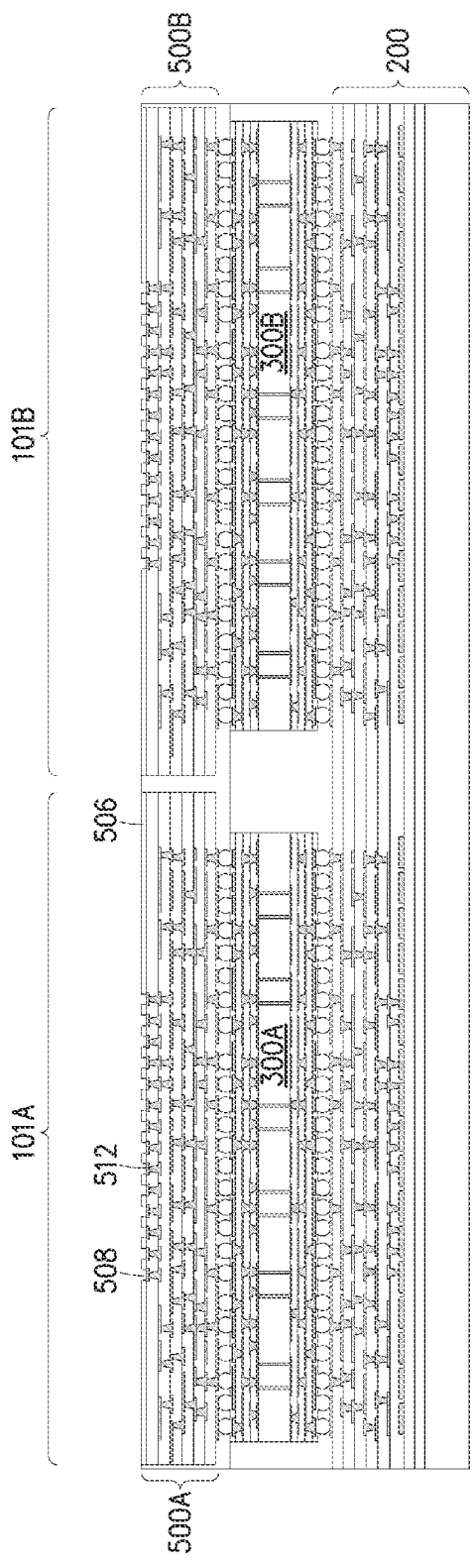

In FIG. 22 openings 508 are formed in the protective layer 506 of the second redistribution structure 500, exposing the conductive lines 512. The openings 508 may be formed by a drilling process such as laser drilling, mechanical drilling, or the like. Alternatively, where the protective layer 506 is formed of a photosensitive material such as PBO, polyimide, BCB, or the like, openings 508 may be patterned using a lithography mask. The patterning forms openings exposing portions of the conductive lines 512. The patterning may be by an acceptable process, such as by exposing and developing the protective layer 506 to light when the protective layer 506 is a photosensitive material or by etching using, for example, an anisotropic etch when using a non-photosensitive material.

Figure 23:
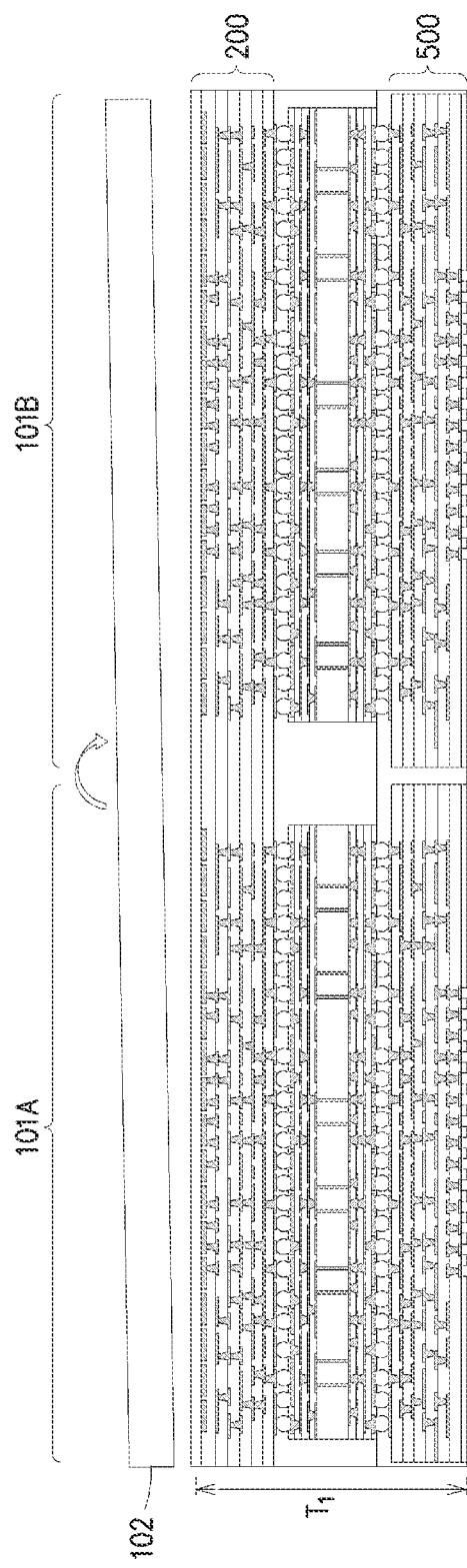

In FIG. 23, a carrier substrate de-bonding is performed to detach (or "de-bond") the carrier substrate 102 from the first redistribution structure 200. In accordance with some embodiments, the de-bonding includes projecting a light such as a laser light or an UV light on the release layer 104

(see FIG. 22) so that the release layer 104 decomposes under the heat of the light and the carrier substrate 102 can be removed. In some embodiments, at this point, the thickness T1 of the resulting structure is between 150 µm and 5000 µm.

Figure 24:
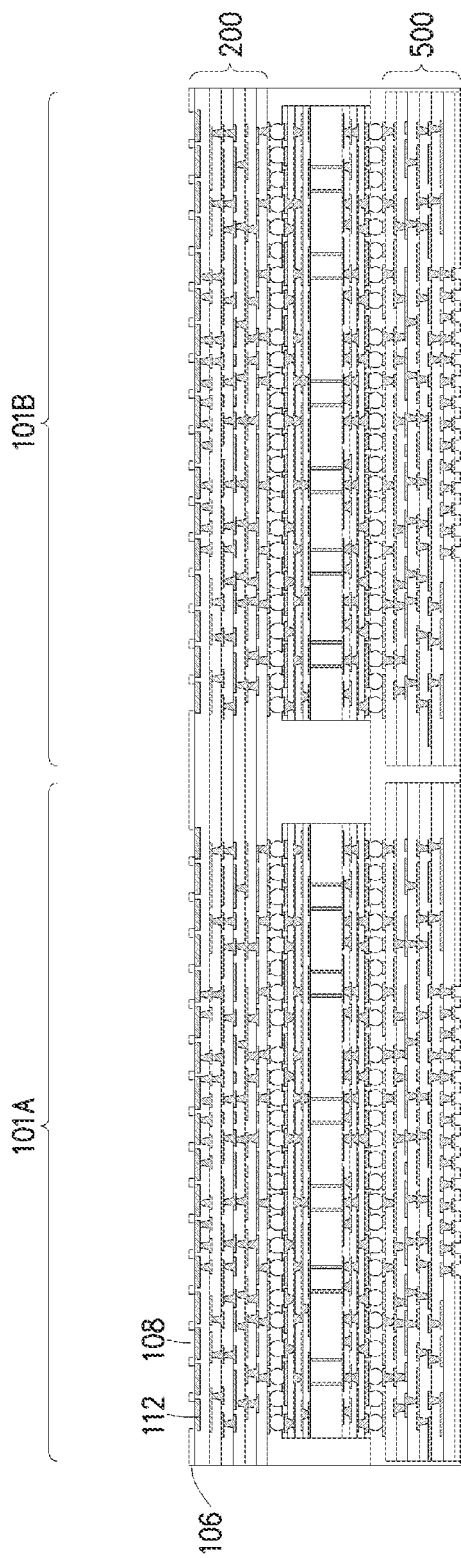

In FIG. 24 openings 108 are formed in the protective layer 106, exposing the conductive lines 112. The openings 108 may be formed by a drilling process such as laser drilling, mechanical drilling, or the like. In embodiments in which the protective layer 106 is formed of a photosensitive material, such as PBO, polyimide, BCB, or the like, the openings 108 may be patterned by exposing the protective layer 106 to light in accordance with a mask and developing the protective layer 106. In embodiments in which the protective layer 106 comprises a non-photosensitive material, such as silicon oxide, silicon nitride, or the like, an anisotropic etch process with a patterned mask may be used.

Figure 25:
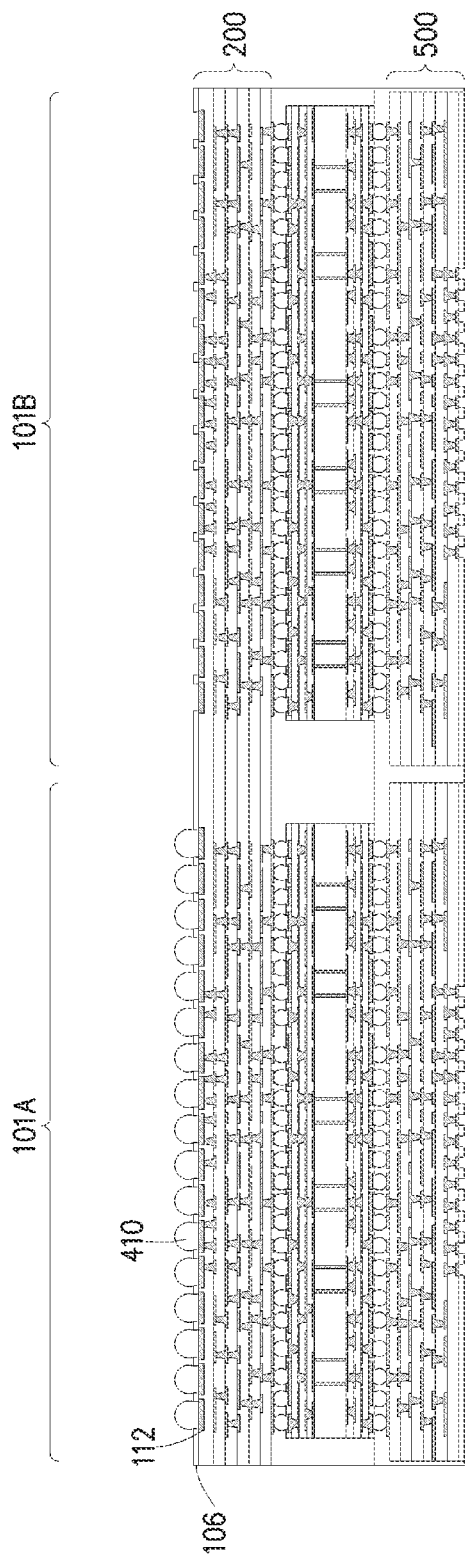

Conductive connectors may be used to bond the first redistribution structure 200 to an integrated circuit package 600 (see FIG. 1). For example, in the embodiment shown in FIG. 25, conductive connectors 410 are formed in the openings 108 (see FIG. 24) coupled to the exposed conductive lines 112. The conductive connectors 410 may be ball grid array (BGA) connectors, solder balls (as shown), metal pillars, controlled collapse chip connection (C4) bumps, micro bumps, electroless nickel-electroless palladium-immersion gold technique (ENEPIG) formed bumps, or the like. The conductive connectors 410 may include a conductive material such as solder, copper, aluminum, gold, nickel, silver, palladium, tin, the like, or a combination thereof. In some embodiments, the conductive connectors 410 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 410 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 26:
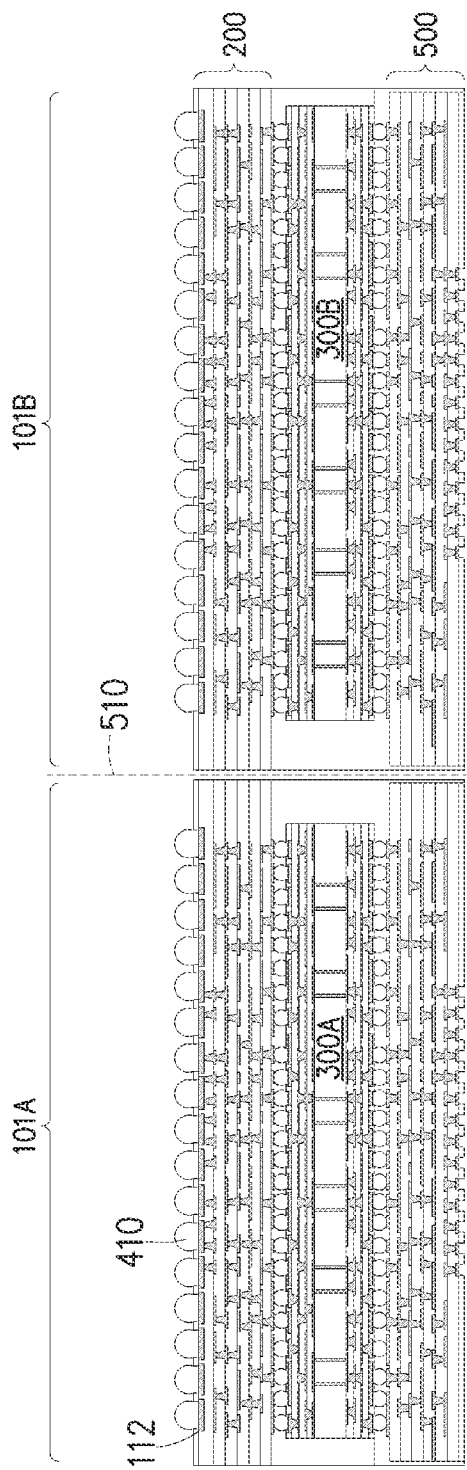

In FIG. 26, a singulation process is performed by sawing along scribe line regions, e.g., between the first package region 101A and the second package region 101B. The sawing singulates the first package region 101A from adjacent package regions, including second package region 101B (shown) to form multiple singulated package components. As illustrated in FIG. 26, sidewalls of the second redistribution structure 500 are covered with the encapsulant 395, and sidewalls of the core substrate 300 are covered with the encapsulant 380, thereby protecting the sidewalls of the second redistribution structure 500 and the core substrates 300A and 300B during and after singulation.

An integrated circuit package 600, as shown in FIG. 1, may be attached to the singulated package component 100 through the conductive connectors 410. The conductive connectors 410 attach the integrated circuit package 600 to the conductive lines 112 of the singulated package component 100. Attaching the integrated circuit package 600 may include placing the integrated circuit package 600 on the conductive connectors 410 and reflowing the conductive connectors 410 to physically and electrically couple the integrated circuit package and the singulated package component 100. The integrated circuit package 600 may include a logic die 620 and one or more I/O dies 640 for interfacing with the logic die 620. The number, types, and arrangement of dies included in integrated circuit package is not limiting, and alternate dies and arrangements may be utilized in different embodiments. Multiple integrated circuit packages may be included by repeating the steps described above, in conjunction with the necessary metallization necessary to provide electrical connection to the multiple integrated circuits packages.

In some embodiments, a third underfill 710 is formed surrounding the conductive connectors 410 and the integrated circuit package 600. The third underfill 710 may reduce stress and protect the joints resulting from the reflowing of the conductive connectors 410. The third underfill may be formed by a capillary flow process after the integrated circuit package 600 is attached, or may be formed by a suitable deposition method. In some embodiments, a single layer of third underfill 710 is formed beneath multiple adjacent devices, and further subsequent underfills (not shown) may be formed beneath and/or around additional devices placed on top of the singulated package component 100.

External connectors 720, as shown in FIG. 1, are formed on the conductive lines 512. The external connectors 720 may be ball grid array (BGA) connectors, solder balls, metal pillars, controlled collapse chip connection (C4) bumps, micro bumps, or the like. The external connectors 720 may include a conductive material such as solder, copper, aluminum, gold, nickel, silver, palladium, tin, the like, or a combination thereof. In some embodiments, the external connectors 720 are formed by initially forming a layer of reflowable material on the conductive lines 512 through evaporation, electroplating, printing, solder transfer, ball placement, or the like. Once a layer of reflowable material has been formed on the conductive lines 512 a reflow may be performed in order to shape the material into the desired bump shapes.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. For example, because the layers in the first redistribution structure 200 and the second redistribution structure 500 are symmetrical within the singulated package component wo fabrication stresses across the singulated package component 100 are approximately equalized on either side of the core substrate. In this manner warpage issues which may result from coefficient of thermal expansion (CTE) mismatches between the different layers of the singulated package component wo are reduced. To further reduce warpage effects, individual metallization patterns within the first redistribution structure 200 and second redistribution structure 500 may use metallization patterns which closely mirror one another at each layer so that the left side of the pattern is the same as the right side of the pattern for any particular one of the metallization patterns.

Additionally, due to the method of construction wherein the first redistribution structure 200 and the second redistribution structure 500 are both built up on a carrier substrate separately and later coupled together, known techniques for semiconductor fabrication may be used at higher layers in the singulated package component 100 without affecting the lower layers. For example, the top layers (as viewed in FIG. 26) of the first redistribution structure 200 may be formed using a methods compatible with CMP processes without subjecting the core substrate 300, and associated electrical connectors, to the stresses of that CMP process. This further enhances component and board level reliability of the singulated package component mo.

In an embodiment, a device includes a core substrate; a first redistribution structure is coupled to a first side of the core substrate, the first redistribution structure includes one or more first redistribution layers; a second redistribution structure is coupled to a second side of the core substrate opposite the first redistribution structure, the second redistribution structure includes one or more second redistribution layers, where each of the first redistribution structure and second redistribution structure includes: one or more first redistribution layers, where each of the one or more first redistribution layers includes a first dielectric layer and a first metallization layer; and one or more second redistribution layers, each of the one or more second redistribution layers includes a second dielectric layer and a second metallization layer, the first dielectric layer includes a different material than the second dielectric layer, the one or more first redistribution layers of the first redistribution structure and the second redistribution structure are closer to the core substrate than the one or more second redistribution layers of the first redistribution structure and the second redistribution structure, respectively; a first integrated circuit die coupled to the first redistribution structure, the first redistribution structure being interposed between the core substrate and the first integrated circuit die; and a set of external conductive features coupled to the second redistribution structure opposite the core substrate.

In an embodiment of the device, the first redistribution structure is coupled to the core substrate using first solder connections, and the second redistribution structure is coupled to the core substrate using second solder connections. In an embodiment of the device, includes an encapsulant interposed between the first redistribution structure and the core substrate and interposed between the second redistribution structure and the core substrate. In an embodiment of the device, the encapsulant includes a first encapsulant layer interposed between the first redistribution structure and the core substrate; and a second encapsulant layer interposed between the second redistribution structure and the core substrate. In an embodiment of the device, the first encapsulant layer and the second encapsulant layer are different materials. In an embodiment of the device, the encapsulant extends along sidewalls of the core substrate. In an embodiment of the device, the encapsulant extends along sidewalls of the second redistribution structure, sidewalls of the first redistribution structure being free of the encapsulant. In an embodiment of the device, a thickness of the first dielectric layer is greater than a thickness of the second dielectric layer.

In another embodiment, a method includes: forming a first redistribution structure including one or more layers over a first carrier substrate and forming a second redistribution structure including one or more layers over a second carrier substrate, each of the first redistribution structure and the second redistribution structure includes: forming one or more first redistribution layers, each of the one or more first redistribution layers including a first dielectric layer and a first metallization layer; and forming one or more second redistribution layers over the one or more first redistribution layers, each of the one or more second redistribution layers including a second dielectric layer and a second metallization layer; electrically connecting a core substrate to an upper layer of the one or more second redistribution layers of the first redistribution structure; electrically connecting an upper layer of the one or more second redistribution layers of the second redistribution structure to the core substrate, where the core substrate is interposed between the first redistribution structure and the second redistribution structure; de-bonding the second carrier substrate from the second redistribution structure; de-bonding the first carrier substrate from the first redistribution structure; and electrically connecting a semiconductor device to the first redistribution structure opposite the core substrate.

In an embodiment of the method, the semiconductor device includes an integrated circuit die package, the integrated circuit die package including a plurality of integrated circuit dies. In an embodiment of the method, after electrically connecting the core substrate to the upper layer of the one or more second redistribution layers of the first redistribution structure, forming a first encapsulant around the core substrate. In an embodiment of the method, after electrically connecting the upper layer of the one or more second redistribution layers of the second redistribution structure to the core substrate: singulating the second redistribution structure; and forming a second encapsulant along sidewalls of the second redistribution structure. In an embodiment of the method, after forming the second encapsulant, singulating through the second encapsulant, the first encapsulant, and the first redistribution structure. In an embodiment of the method, forming a set of external conductive features on a side of the second redistribution structure opposite the core substrate.

In another embodiment a device including: a first redistribution structure, the first redistribution structure including one or more first redistribution layers, the first redistribution structure including a first number of the one or more first redistribution layers; a second redistribution structure, the second redistribution structure including one or more second redistribution layers, the second redistribution structure including the first number of the one or more second redistribution layers; a core substrate interposed between the first redistribution structure and the second redistribution structure, the core substrate being coupled to a first side of the first redistribution structure using a first set of conductive connectors, the core substrate being coupled to a first side of the second redistribution structure using a second set of conductive connectors, the core substrate being spaced apart from the first redistribution structure, the core substrate being spaced apart from the second redistribution structure, where a width of the first redistribution structure is greater than a width of the core substrate and a width of the second redistribution structure; and an integrated circuit die package coupled to a second side of the first redistribution structure using a third set of conductive connectors.

In an embodiment of the device, the first set of conductive connectors, second set of conductive connectors, and third set of conductive connectors each includes solder. In an embodiment of the device, an encapsulant is interposed between the core substrate and the first redistribution structure, the encapsulant being interposed between the core substrate and the second redistribution structure. In an embodiment of the device, each of the first redistribution structure and the second redistribution structure includes: one or more first layers, where each of the one or more first layers includes a first dielectric layer and a first metallization layer; and one or more second layers, where each of the one or more second layers includes a second dielectric layer and a second metallization layer, where each of the one or more second layers is thicker than each of the one or more first layers, where the first dielectric layer includes a different material than the second dielectric layer, and where the first layers are closer to the core substrate than the second layers. In an embodiment of the device, a number of the first layers is less than a number of the second layers. In an embodiment of the device, the second metallization layer includes a second set of conductive lines with lower impedance than a first set of conductive lines in the first metallization layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a core substrate;
   a first redistribution structure coupled to a first side of the core substrate; and
   a second redistribution structure coupled to a second side of the core substrate opposite the first redistribution structure, wherein each of the first redistribution structure and second redistribution structure comprises:
   one or more first redistribution layers comprising first dielectric layers of a first material; and
   one or more second redistribution layers, comprising second dielectric layers of a second material different than the first material;
   wherein the one or more first redistribution layers of the first redistribution structure and the second redistribution structure are closer to the core substrate than the one or more second redistribution layers of the first redistribution structure and the second redistribution structure, respectively.

2. The device of claim 1, wherein the first redistribution structure is coupled to the core substrate using first solder connections, wherein the second redistribution structure is coupled to the core substrate using second solder connections.

3. The device of claim 1 further comprising an encapsulant interposed between the first redistribution structure and the core substrate and interposed between the second redistribution structure and the core substrate.

4. The device of claim 3, wherein the encapsulant comprises:
   a first encapsulant layer interposed between the first redistribution structure and the core substrate; and
   a second encapsulant layer interposed between the second redistribution structure and the core substrate.

5. The device of claim 4, wherein the first encapsulant layer and the second encapsulant layer comprise different materials.

6. The device of claim 3, wherein the encapsulant extends along sidewalls of the core substrate.

7. The device of claim 3, wherein the encapsulant extends along sidewalls of the second redistribution structure, sidewalls of the first redistribution structure being free of the encapsulant.

8. The device of claim 1, wherein a thickness of the first dielectric layers is greater than a thickness of the second dielectric layers.

9. A device comprising:
   a first redistribution structure comprising a first number of redistribution layers;
   a second redistribution structure comprising the first number of redistribution layers;
   a core substrate interposed between the first redistribution structure and the second redistribution structure, wherein a width of the first redistribution structure is greater than a width of the core substrate and a width of the second redistribution structure; and
   an integrated circuit die package coupled to the first redistribution structure opposite the core substrate.

10. The device of claim 9, further comprising an encapsulant, wherein the encapsulant fills a first area between the first redistribution structure and the core substrate and fills a second area between the second redistribution structure and the core substrate.

11. The device of claim 10, wherein the encapsulant comprises:
    a first encapsulant layer filling the first area; and
    a second encapsulant layer filling the second area.

12. The device of claim 10, wherein a first portion of the encapsulant between the first redistribution structure and the core substrate and a second portion of the encapsulant between the second redistribution structure and the core substrate comprise the same material.

13. The device of claim 10, wherein the encapsulant covers sidewalls of the core substrate and the second redistribution structure.

14. The device of claim 10, wherein the encapsulant does not extend along sidewalls of the first redistribution structure.

15. A device comprising:
    a core substrate, wherein the core substrate comprises conductive and insulating materials, and wherein the core substrate has a first width;
    a first redistribution structure coupled to a first side of the core substrate, wherein the first redistribution structure has a second width;
    a second redistribution structure coupled to a second side of the core substrate opposite the first redistribution structure, wherein the second redistribution structure has a third width, and wherein each of the first redistribution structure and second redistribution structure comprises:
    one or more first redistribution layers, wherein each of the one or more first redistribution layers comprises a first dielectric layer and a first metallization layer; and
    one or more second redistribution layers, wherein each of the one or more second redistribution layers comprises a second dielectric layer and a second metallization layer, wherein the first dielectric layer comprises a different material than the second dielectric layer, wherein the one or more first redistribution layers of the first redistribution structure and the second redistribution structure are closer to the core substrate than the one or more second redistribution layers of the first redistribution structure and the second redistribution structure, respectively;

a first integrated circuit die coupled to the first redistribution structure, wherein the first integrated circuit die has a fourth width, and wherein the first redistribution structure is interposed between the core substrate and the first integrated circuit die; and a set of external conductive features coupled to the second redistribution structure opposite the core substrate;

wherein the first width is greater than the second width and the third width, wherein the second width is greater than the fourth width, and wherein the third width is greater than the fourth width.

16. The device of claim 15, further comprising:

a first encapsulant between the first redistribution structure and the first side of the core substrate; and a second encapsulant between the second redistribution structure and the second side of the core substrate.

17. The device of claim 16, wherein the first encapsulant and the second encapsulant are different molding compounds.

18. The device of claim 15, further comprising:

an encapsulant between the first redistribution structure and the core substrate, along sidewalls of the core substrate, and between the second redistribution structure and the core substrate.

19. The device of claim 18, wherein the encapsulant further extends along sidewalls of the second redistribution structure, and wherein sidewalls of the first redistribution structure are free of the encapsulant.

20. The device of claim 15, further comprising:

first solder connections coupling the first redistribution structure to the first side of the core substrate; and second solder connections coupling the second redistribution structure to the second side of the core substrate opposite the first redistribution structure.

* * * * *